(12) United States Patent
Rananavare et al.

(10) Patent No.: US 11,260,420 B2
(45) Date of Patent: Mar. 1, 2022

(54) NANOWIRES WITH MAGNETIC COATINGS AND METHODS FOR MAKING AND USING

(71) Applicant: Portland State University, Portland, OR (US)

(72) Inventors: Shankar B. Rananavare, Hillsboro, OR (US); Srikar Rao Darmakkolla, Beaverton, OR (US)

(73) Assignee: Portland State University, Portland, OR (US)

( * ) Notice: Subject to any disclaimer, the term of this patent is extended or adjusted under 35 U.S.C. 154(b) by 48 days.

(21) Appl. No.: 16/601,460

(22) Filed: Oct. 14, 2019

(65) Prior Publication Data

US 2020/0122192 A1 Apr. 23, 2020

Related U.S. Application Data

(60) Provisional application No. 62/747,053, filed on Oct. 17, 2018.

(51) Int. Cl.
*B05D 3/00* (2006.01)
*H01L 21/768* (2006.01)
*H01L 23/532* (2006.01)

(52) U.S. Cl.
CPC ........ *B05D 3/207* (2013.01); *H01L 21/76838* (2013.01); *H01L 23/53238* (2013.01)

(58) Field of Classification Search
CPC ........ H01L 23/53238; H01L 21/76838; B05D 3/207; B05D 1/005; B01J 23/40; B01J 23/50; B01J 37/0207; B01J 31/069; B01J 23/44; B01J 35/1061; B01J 23/52; B01J 19/0093; C08F 293/005; C08F 8/34; C09D 153/005; C09D 7/65; C09D 5/008; C09D 5/20; C01B 32/168; H01J 1/304; H01J 9/025
USPC ............ 438/542; 257/24, E21.135, E21.466; 313/355, 309, 311, 351, 495; 174/36; 502/158; 528/26; 435/6.1, 287.1, 283.1, 435/287.2
See application file for complete search history.

(56) References Cited

U.S. PATENT DOCUMENTS

| 6,028,015 | A | 2/2000 | Wang et al. |
| 6,482,754 | B1 | 11/2002 | Andideh et al. |
| 6,741,019 | B1* | 5/2004 | Filas ............... H01J 1/304 313/309 |
| 8,501,406 | B1* | 8/2013 | Gray ............... C12Q 1/6869 435/6.1 |
| 2003/0228762 | A1* | 12/2003 | Moeggenborg ... H01L 21/31053 438/691 |

(Continued)

OTHER PUBLICATIONS

Bentley et al., "Magnetic Manipulation of Copper-Tin Nanowires Capped with Nickel Ends," *Nano Letters*, vol. 4, No. 3, pp. 487-490 (2004).

(Continued)

*Primary Examiner* — Mouloucoulaye Inoussa
(74) *Attorney, Agent, or Firm* — Klarquist Sparkman, LLP

(57) ABSTRACT

Coated nanowires comprising a core and a ferromagnetic coating are magnetically aligned and bound to a substrate. The substrate may have a thiol-functionalized surface. In some examples, the coated nanowires are nickel-coated copper nanowires and the substrate may be a carbon-doped oxide or silicon oxide.

28 Claims, 17 Drawing Sheets
(15 of 17 Drawing Sheet(s) Filed in Color)

(56) References Cited

U.S. PATENT DOCUMENTS

| | | | | |
|---|---|---|---|---|
| 2010/0164489 | A1* | 7/2010 | Lukaszew | G01N 33/54326 324/244.1 |
| 2012/0106111 | A1* | 5/2012 | Mazzochette | H01L 24/29 361/783 |
| 2012/0119760 | A1* | 5/2012 | Pehrsson | H01L 29/0676 324/691 |
| 2013/0040070 | A1* | 2/2013 | Jung | G03F 7/0002 427/553 |
| 2013/0118775 | A1* | 5/2013 | Zeng | H01B 1/16 174/126.2 |
| 2014/0221195 | A1* | 8/2014 | Kim | B01J 23/40 502/158 |
| 2017/0170381 | A1* | 6/2017 | Norris | H01L 35/32 |
| 2018/0159133 | A1* | 6/2018 | Schoo | H01M 4/661 |

OTHER PUBLICATIONS

Chang et al., "Large-Scale Synthesis of High-Quality Ultralong Copper Nanowires," *Langmuir*, vol. 21, No. 9, pp. 3746-3748 (Mar. 29, 2005).
Cho et al., "Large-Area Cross-Aligned Silver Nanowire Electrodes for Flexible, Transparent, and Force-Sensitive Mechanochromic Touch Screens," *ACS Nano*, vol. 11, pp. 4346-4357 (Apr. 11, 2017).
Darmakkolla, Srikar R., "Copper Nanowires Synthesis and Self-assembly for Interconnect Applications," *Dissertation: Portland State University*, 152 pages (2017).
Darmakkolla, Srikar R., "Copper Nanowires Synthesis and Self-assembly for Interconnect Applications," *Abstract of Dissertation: Portland State University*, 4 pages (2017).
Darmakkolla et al., "A method to derivatize surface silanol groups to Si-alkyl groups in carbon-doped silicon oxides," *RSC Adv.*, vol. 6, pp. 93219-93230 (2016).
Garnett et al., "Self-limited plasmonic welding of silver nanowire junctions," *Nature Materials, Advance Online Publication*, Published online Feb. 5, 2012, 9 pages.
Hangarter et al., "Hierarchical magnetic assembly of nanowires," *Nanotechnology*, vol. 18, 205305, 8 pages (2007).
Hangarter et al., "Magnetic Alignment of Nanowires," *Chem. Mater.*, vol. 17, pp. 1320-1324 (2005).
Hu et al., "Magnetic Field-Induced Solvothermal Synthesis of One-Dimensional Assemblies of Ni—Co Alloy Microstructures," *Nano Research*, vol. 1, pp. 303-313 (2008).
Kim et al., "Ethylenediamine Promotes Cu Nanowire Growth by Inhibiting Oxidation of Cu(111), " *JACS*, vol. 139, pp. 277-284 (Dec. 15, 2016).
Lieber, Charles M., "Nanoscale Science and Technology: Building a Big Future from Small Things," *MRS Bulletin*, pp. 486-491 (Jul. 2003).
Liu et al., "Macroscopic-Scale Assembled Nanowire Thin Films and Their Functionalities," *Chem. Rev.*, vol. 112, pp. 4770-4799 (Jun. 18, 2012).
Moyer, "Life at 10nm. (Or is it 7nm?) And 3nm Views on Advanced Silicon Platforms," *EE. Journal*, 12 pp., (Mar. 12, 2018).
Mutiso et al., "Integrating Simulations and Experiments to Predict Sheet Resistance and Optical Transmittance in Nanowire Films for Transparent Conductors," *ACS Nano*, vol. 7, No. 9, pp. 7654-7663 (Aug. 9, 2013).
Rathmell et al., "Synthesis of Oxidation-Resistant Cupronickel Nanowires for Transparent Conducting Nanowire Networks," *Nano Letters*, 7 pages (2012).
Sperling, "BEOL Issues at 10 nm and 7 nm," *Semiconductor Engineering*, 5 pp., (Jan. 31, 2017).
Stewart et al., "Synthesis of Cu—Ag, Cu—Au, and Cu—Pt Core-Shell Nanowires and Their Use in Transparent Conducting Films," *Chem. Mater.*, Just Accepted Manuscript, 24 pages (Nov. 4, 2015).
Tanase et al., "Magnetic trapping and self-assembly of multicomponent nanowires," *Journal of Applied Physics*, vol. 91, No. 10, 8549-8551 (May 15, 2002).
Wang et al., "Directed assembly of nanowires," *Materials Today*, vol. 12, No. 5, pp. 34-43 (May 2009).
Xu et al., "Copper Nanowires as Nanoscale Interconnects: Their Stability, Electrical Transport, and Mechanical Properties," *ACS Nano*, vol. 9, No. 1, pp. 241-250 (2015; published online Dec. 18, 2014).
Yang et al., "A room-temperature environmentally friendly solution process to assemble silver nanowire architectures for flexible transparent electrodes," *Royal Society of Chemistry, Nanoscale*, vol. 9, pp. 52-55 (2017).
Ye et al., "Integrating Nanowires with Substrates Using Directed Assembly and Nanoscale Soldering," *IEEE Transactions on Nanotechnology*, vol. 5, No. 1, pp. 62-66 (Jan. 2006).
Ye et al., "A rapid synthesis of high aspect ratio copper nanowires for high-performance transparent conducting films," *Chem. Commun.* vol. 50, pp. 2562-2564 (2014).
Afsar et al., "Precise Millimeter-Wave Measurements of Complex Refractive Index, Complex Dielectric Permittivity and Loss Tangent of GaAs, Si, $SiO_2$, $Al_2O_3$, BeO, Macor, and Glass," *IEEE Transactions on Microwave Theory And Techniques* MTT-31(2):217-223, 1983.
An et al., "A new route to synthesis of surface hydrophobic silica with long-chain alcohols in water phase," *Colloids and Surfaces A: Physicochem. Eng. Aspects* 369:218-222, 2010.
Anderson et al., "The Electrical Conductivity of Silica Gel in the Presence of Adsorbed Water," *The Journal of Physical Chemistry* 72(10):3662-3668, 1968.
Ashu-Arrah et al., "Preparation and characterization of bonded silica hydride intermediate from triethoxysilane and dimethylmethoxysilane using supercritical carbon dioxide and dioxane as reaction medium," *Journal of Chromatography A*, 1236:42-50, 2012.
Baklanov et al., "Advanced Interconnects: Materials, Processing, and Reliability," *ECS Journal of Solid State Science and Technology* 4(1):Y1-Y4, 2015.
Barako et al., "Thermal Conduction in Vertically Aligned Copper Nanowire Arrays and Composites," *ACS Appl. Mater. Interfaces* 7:19251-19259, 2015.
Barceloux, "Copper," *Clinical Toxicology* 37(2):217-230, 1999.
Bower et al., "Analysis of Failure Mechanisms in the Interconnect Lines of Microelectronic Circuits," *Fatigue & Fracture of Engineering Materials & Structures* 21:611-630, 1998.
Brain, "Interconnect Scaling: Challenges and Opportunities," IEEE International Electron Devices Meeting (IEDM), Dec. 3-7, 2016, San Francisco, CA, pp. 16-232-16-235.
Buriak, "Organometallic Chemistry on Silicon and Germanium Surfaces," *Chemical Reviews* 102(5):1272-1308, 2002.
Cassie, "Contact Angles," *Discussions of the Faraday Society* 3:11-16, 1948.
Catenacci et al., "Stretchable Conductive Composites from Cu—Ag Nanowire Felt," *ACS Nano* 12:3689-3698, 2018.
Catenacci et al., "Stretchable Conductive Composites from Cu—Ag Nanowire Felt," *ACS Nano*, Supporting Information, 5 pages, 2018.
Chan et al., "Controlled Deposition of Tin Oxide and Silver Nanoparticles Using Microcontact Printing," *Crystals* 5:116-142, 2015.
Chang et al., "Large-Scale Synthesis of High-Quality Ultralong Copper Nanowires," *Langmuir* 21:3746-3748, 2005.
Chang et al., "Moisture-Induced Material Instability of Porous Organosilicate Glass," *Electrochemical and Solid-State Letters*, 6(4):F13-F15, 2003.
Chang et al., "Recovering Dielectric Loss of Low Dielectric Constant Organic Siloxane during the Photoresist Removal Process," *Journal of The Electrochemical Society* 149(8):F81-F84, 2002.
Chaparadza et al., "Room temperature $Cl_2$ sensing using thick nanoporous films of Sb-doped $SnO_2$," *Nanotechnology* 19(245501): 2008, 8 pages.
Chen et al., "Metallic Copper Nanostructures Synthesized by a Facile Hydrothermal Method," *Journal of Nanoscience and Nanotechnology* 10:629-636, 2010.
Cho et al., "Grain size dependence of electromigration-induced failures in narrow interconnects," *Appl. Phys. Lett.* 54(25):2577-2579, 1989.

(56) References Cited

OTHER PUBLICATIONS

Cho et al., "Large-Area Cross-Aligned Silver Nanowire Electrodes for Flexible, Transparent, and Force-Sensitive Mechanochromic Touch Screens," *ACSNANO* 11:4346-4357, 2017.

Choi et al., "Seedless Growth of Free-Standing Copper Nanowires by Chemical Vapor Deposition," *J. Am. Chem. Soc.* 126:6248-6249, 2004.

Critchley et al., "Near-Bulk Conductivity of Gold Nanowires as Nanoscale Interconnects and the Role of Atomically Smooth Interface," *Adv. Mater.* 22:2338-2342, 2010.

Cruz et al., "Multigram Synthesis of Cu—Ag Core-Shell Nanowires Enables the Production of a Highly Conductive Polymer Filament for 3D Printing Electronics," *Part. Part. Syst. Charact.* 35(1700385): 2018, 10 pages.

Cruz et al., "Multigram Synthesis of Cu—Ag Core-Shell Nanowires Enables the Production of a Highly Conductive Polymer Filament for 3D Printing Electronics," *Part. Part. Syst. Charact.*, Supporting Information, 2013, 7 pages.

Darmakkolla et al., "A method to derivatize surface silanol groups to Si-alkyl groups in carbon-doped silicon oxides," *RSC Adv.* 6:93219-93230, 2016.

Darmakkolla et al., "Morphology-controlled copper nanowire synthesis and magnetic field assisted self-assembly," *Nanoscale* 11:2679-2686, 2019.

De Smet et al., "Mechanism of the Hydrosilylation Reaction of Alkenes at Porous Silicon: Experimental and Computational Deuterium Labeling Studies," *J. Phys. Chem. B* 109:12020-12031, 2005.

Dorcheh et al., "Silica aerogel; synthesis, properties and characterization," *Journal of Materials Processing Technology* 199:10-26, 2008.

Fan et al., "Wafer-Scale Assembly of Highly Ordered Semiconductor Nanowire Arrays by Contact Printing," *Nano Letters* 8(1):20-25, 2008.

Fischer et al., "Electromigration Failure Mechanism Studies on Copper Interconnects," International Interconnect Technology Conference, Jun. 5, 2002, Burlingame, CA, pp. 139-141.

Friedman, "A saturation degree-dependent composite spheres model for describing the effective dielectric constant of unsaturated porous media," *Water Resources Research* 34(11):2949-2961, 1998.

Fujii et al., "Formation of Si-based organic thin films with low dielectric constant by using remote plasma enhanced chemical vapor deposition from hexamethyldisiloxane," *This Solid Films* 343-344:457-460, 1999.

Gao et al., "Coaxial Metal Nano-/Microcables with Isolating Sheath: Synthetic Methodology and Their Application as Interconnects," *Adv. Mater.* 22:1977-1981, 2010.

Gargini, "How to Successfully Overcome Inflection Points, or Long Live Moore's Law," *Computing in Science & Engineering* 19(2):51-62, 2017.

Garnett et al., "Self-limited plasmonic welding of silver nanowire junctions," *Nature Materials* 11:241-249, 2012.

Gelves et al., "Electrostatically Dissipative Polystyrene Nanocomposites containing Copper Nanowires," *Macromol. Rapid Commun.* 26:1677-1681, 2005.

Grill et al., "Low dielectric constant films prepared by plasma-enhanced chemical vapor deposition from tetramethylsilane," *Journal of Applied Physics* 85(6):3314-3318, 1999.

Grill et al., Structure of low dielectric constant to extreme low dielectric constant SiCOH films: Fourier transform infrared spectroscopy characterization *Journal of Applied Physics* 94(10):6697-6707, 2003.

Grill et al., "Ultralow-k dielectrics prepared by plasma-enhanced chemical vapor deposition," *Applied Physics Letters* 79(6):803-805, 2001.

Grill, "Amorphous carbon based materials as the interconnect dielectric in ULSI chips," *Diamond and Related Materials* 10:234-239, 2001.

Gurav et al., "Silica Aerogel: Synthesis and Applications," *Journal of Nanomaterials* 2010(409310): 2010, 11 pages.

Han et al., "Fast Plasmonic Laser Nanowelding for a Cu-Nanowire Percolation Network for Flexible Transparent Conductors and Stretchable Electronics," *Adv. Mater.* 26:5808-5814, 2014.

Han et al., "Fast Plasmonic Laser Nanowelding for a Cu-Nanowire Percolation Network for Flexible Transparent Conductors and Stretchable Electronics," *Adv. Mater.*, Supporting Information, 2014, 24 pages.

Han et al., "Nanorecycling: Monolithic Integration of Copper and Copper Oxide Nanowire Network Electrode through Selective Reversible Photothermochemical Reduction," *Adv. Mater.* 27:6397-6403, 2015.

Han et al., "Nanorecycling: Monolithic Integration of Copper and Copper Oxide Nanowire Network Electrode through Selective Reversible Photothermochemical Reduction," *Adv. Mater.* Supporting Information, 2015, 11 pages.

Han et al., "Ultra Low-k Porous Silicon Dioxide Films from a Plasma Process," International Interconnect Technology Conference, Jun. 6, 2001, Burlingame, CA, 3 pages.

Hangarter et al., "Magnetic Alignment of Nanowires," *Chem. Mater.* 17:1320-1324, 2005.

Heidenreich et al., "Full Copper Wiring in a Sub-0.25 µm CMOS ULSI Technology," International Electron Devices Meeting. IEDM Technical Digest, Dec. 10, 1997, Washington, DC, pp. 31.3.1-31.3.4.

Hu et al., "Structure and morphology of self-assembled 3-mercaptopropyltrimethoxysilane layers on silicon oxide," *Applied Surface Science* 181:307-316, 2001.

Humphreys et al., "High resolution electron backscatter diffraction with a field emission gun scanning electron microscope," *Journal of Microscopy* 195(1):6-9, 1999.

IBM "Copper Interconnects : The Evolution of Microprocessors," downloaded on Sep. 11, 2021 from https://www.ibm.com/ibm/history/ibm100/us/en/icons/copperchip/, 4 pages.

Jagota et al., "Conductivity of Nanowire Arrays under Random and Ordered Orientation Configurations," *Scientific Reports* 5(10219): 2019, 5 pages.

Jal et al., "Chemical modification of silica surface by immobilization of functional groups for extractive concentration of metal ions," *Talanta* 62:1005-1028, 2004.

Jason et al., "Copper Nanowires as Conductive Ink for Low-Cost Draw-On Electronics," *ACS Appl. Mater. Interfaces* 7:16760-16766, 2015.

Jennings et al., "Effect of Chain Length on the Protection of Copper by n-Alkanethiols," *Langmuir* 14:6130-6139, 1998.

Jing et al., "Chemical Bond Structure on Si—O—C Composite Films with a Low Dielectric Constant Deposited by Using Inductively Coupled Plasma Chemical Vapor Deposition," *Journal of the Korean Physical Society* 41(5):769-773, 2002.

Jonkheijm et al., "Chemical Strategies for Generating Protein Biochips," *Angew. Chem. Int. Ed.* 47:9618-9647, 2008.

Kartal et al., "Surface modification of silica aerogels by hexamethyldisilazane-carbon dioxide mixtures and their phase behavior," *J. of Supercritical Fluids* 53:115-120, 2010.

Keller et al., "Transmission EBSD from 10 nm domains in a scanning electron microscope," *Journal of Microscopy* 245(3):245-251, 2012.

Kim et al., "A Study on Low Dielectric Material Deposition Using a Helicon Plasma Source," *J. Electrochem. Soc.* 143(9):2990-2995, 1996.

Kim et al., "Ethylenediamine Promotes Cu Nanowire Growth by Inhibiting Oxidation of Cu(111)," *J. Am. Chern. Soc.* 139:211-284, 2017.

Kim et al., "Highly Aligned Scalable Platinum-Decorated Single-Wall Carbon Nanotube Arrays for Nanoscale Electrical Interconnects," *ACSNANO* 3(9):2818-2826, 2009.

Kim et al., "Large Discrete Resistance Jump at Grain Boundary in Copper Nanowire," *Nano Lett.* 10:3096-3100, 2010.

Kim et al., "The deposition of SiOF film with low dielectric constant in a helicon plasma source," *Appl. Phys. Lett.* 68(11):1507-1509, 1996.

Knight et al., "The dielectric constant of sandstones, 60kHz to 4 MHz," *Geophysics* 52(5):644-654, 1987.

(56) References Cited

OTHER PUBLICATIONS

Koga et al., "Dependence of the Molecular Aggregation State of Octadecylsiloxane Monolayers on Preparation Methods," *Langmuir* 21:905-910, 2005.
Kovtyukhova et al., "Nanowires as Building Blocks for Self-Assembling Logic and Memory Circuits," *Chem. Eur. J.* 8(19):4355-4363, 2002.
Kumar et al., "Current distribution in conducting nanowire net," *Journal of Applied Physics* 122(045101): 2017, 8 pages.
Le et al., "Removal of Plasma-Modified Low-k Layer Using Dilute HF: Influence of Concentration," *Electrochemical and Solid-State Letters* 8(7):F21-F24, 2005.
Li et al., "Bottom-up approach for carbon nanotube interconnects," *Applied Physics Letters* 82(15):2491-2493, 2003.
Li et al., "Copper deposition and thermal in copper-based metallization for ULSI technology stability issues," *Materials Science Reports* 9:1-51, 1992.
Li et al., "Electrospinning of Polymeric and Ceramic Nanofibers as Uniaxially Aligned Arrays," *Nano Letters* 3(8):1167-1171, 2003.
Lieber, "Nanoscale Science and Technology: Building a Big Future from Small Things," *MRS bulletin* 28(07):486-491, 2003.
Liu et al., "Improvement in Integration Issues for Organic Low-k Hybrid-Organic-Siloxane-Polymer," *Journal of The Electrochemical Society* 148(2):F30-F34, 2001.
Liu et al., "Macroscopic-Scale Assembled Nanowire Thin Films and Their Functionalities," *Chem. Rev.* 112:4770-4799, 2012.
Love et al., "Self-Assembled Monolayers of Thiolates on Metals as a Form of Nanotechnology," *Chem. Rev.* 105:1103-1169, 2005.
Lu et al., "Nanoelectronics from the bottom up," *Nature Materials* 6:841-850, 2007.
Marzi et al., "Probing intrinsic transport properties of single metal nanowires: Direct-write contact formation using a focused ion beam," *Journal of Applied Physics* 96(6):3458-3462, 2004.
Mehta et al., "Enhanced Electrical and Thermal Conduction in Graphene-Encapsulated Copper Nanowires," *Nano Lett.* 15:2024-2030, 2015.
Meng et al., "The Solution Growth of Copper Nanowires and Nanotubes is Driven by Screw Dislocations," *Nano Lett.* 12:234-239, 2012.
Mhaisagar et al., "Mechanical properties of surface modified silica low-k thin films," *Microelectronic Engineering* 114:112-116, 2014.
Mistkawi, "Fundamental Studies in Selective Wet Etching and Corrosion Processes for High-Performance Semiconductor Devices," Dissertation and Theses, Portland State University, Portland, Oregon, 2010, 225 pages.
Mistry et al., "45nm Logic Technology with High-k+Metal Gate Transistors, Strained Silicon, 9 Cu Interconnect Layers, 193nm Dry Patterning, and 100% Pb-free Packaging," IEEE International Electron Devices Meeting, Dec. 10-12, 2007, Washington, DC, pp. 247-250.
Mohl et al., "Low-Temperature Large-Scale Synthesis and Electrical Testing of Ultralong Copper Nanowire," *Langmuir* 26(21):16496-16502, 2010.
Molares et al., "Electrical characterization of electrochemically grown single copper nanowires," *Applied Physics Letters* 82(13):2139-2141, 2003.
Morakinyo et al., "Reducing the effects of shot noise using nanoparticles," *J. Mater. Chem. C*, 3:955-959, 2015.
Murali et al., "Lyotropic Liquid Crystalline Self-Assembly in Dispersions of Silver Nanowires and Nanoparticles," *Langmuir* 26(13):11176-11183, 2010.
Murarka et al., "Copper Metallization for ULS1 and Beyond," *Critical Reviews in Solid State and Materials Sciences* 20(2):87-124, 1995.
Mutiso et al., "Integrating Simulations and Experiments To Predict Sheet Resistance and Optical Transmittance in Nanowire Films for Transparent Conductors," *ACSNANO* 7(9):7654-7663, 2013.
Nadargi et al., "Synthesis and characterization of transparent hydrophobic silica thin films by single step sol-gel process and dip coating," *Journal of Alloys and Compounds* 496:436-441, 2010.

Niu et al., "Removal and Utilization of Capping Agents in Nanocatalysis," *Chem. Mater.* 26:72-83, 2014.
Park et al., "Plasmonic-Tuned Flash Cu Nanowelding with Ultrafast Photochemical-Reducing and Interlocking on Flexible Plastics," *Adv. Funct. Mater.* 27(1701138): 2017, 11 pages.
Park et al., "Plasmonic-Tuned Flash Cu Nanowelding with Ultrafast Photochemical-Reducing and Interlocking on Flexible Plastics," *Adv. Funct. Mater.*, Supporting Information, 2017, 17 pages.
Parthangal et al., "A generic process of growing aligned carbon nanotube arrays on metals and metal alloys," *Nanotechnology* 18(185605): 2007, 5 pages.
Perry, "Chemical Mechanical Polishing: The Impact of a New Technology on an Industry," Symposium on VLSI Technology Digest of Technical Papers, Jun. 9-11, 1998, Honolulu, HI, pp. 2-5.
Pratt, "Overview of the Use of Copper Interconnects in the Semiconductor Industry," Advanced Energy Industries, Inc. 2004, 20 pages.
Quang et al., "A gentle method to graft thiol-functional groups onto silica gel for adsorption of silver ions and immobilization of silver nanoparticles," *Powder Technology* 235:221-227, 2013.
Raciti et al., "Highly Dense Cu Nanowires for Low-Overpotential $CO_2$ Reduction," *Nano Lett.* 15:6829-6835, 2015.
Raciti et al., "Highly Dense Cu Nanowires for Low-Overpotential $CO_2$ Reduction," *Nano Lett.*, Supporting Information, 2015, 18 pages.
Rao et al., "Surface chemical modification of silica aerogels using various alkyl-alkoxy/chloro silanes," *Applied Surface Science* 206:262-270, 2003.
Rathmell et al., "Synthesis of Oxidation-Resistant Cupronickel Nanowires for Transparent Conducting Nanowire Networks," *Nano Lett.* 12:3193-3199, 2012.
Rathmell et al., "The Growth Mechanism of Copper Nanowires and Their Properties in Flexible, Transparent Conducting Films," *Adv. Mater.* 22:3558-3563, 2010.
Rathmell et al., "The Synthesis and Coating of Long, Thin Copper Nanowires to Make Flexible, Transparent Conducting Films on Plastic Substrates," *Adv. Mater.* 23:4798-4803, 2011.
Reichelderfer et al., "The Ultimate By-Products of Stripping Photoresist in an Oxygen Plasma," *J. Electrochem. Soc.: Solid-State Science and Technology* 124(12):1926-1927, 1977.
Reis et al., "Refractive Index of Liquid Mixtures: Theory and Experiment," *ChemPhysChem* 11:3722-3733, 2010.
Rossnagel et al., "Alteration of Cu conductivity in the size effect regime," *J. Vac. Sci. Technol. B* 22(1):240-247, 2004.
Ryan et al., "The evolution of interconnection technology at IBM," *IBM J. Res. Develop.* 39(4):371-381, 1995.
Sakamoto, "High-Frequency Dielectric Relaxation of Water Bound to Hydrophilic Silica Gels," *J. Phys. Chem.* 93:357-366, 1989.
Sandoval et al., "Synthesis and Characterization of a Hydride-Modified Porous Silica Material as an Intermediate in the Preparation of Chemically Bonded Chromatographic Stationary Phases," *Anal. Chem.* 61:2067-2075, 1989.
Shewale et al., "Effect of different trimethyl silylating agents on the hydrophobic and physical properties of silica aerogels," *Applied Surface Science* 254:6902-6907, 2008.
Smith et al., "Electric-field assisted assembly and alignment of metallic nanowires," *Applied Physics Letters* 77(9):1399-1401, 2000.
Stewart et al., "Synthesis of Cu—Ag, Cu—Au, and Cu—Pt Core-Shell Nanowires and Their Use in Transparent Conducting Films," *Chem. Mater.* 27:7788-7794, 2015.
Suratwala et al., "Surface chemistry and trimethylsilyl functionalization of Stöber silica sols," *Journal of Non-Crystalline Solids* 316:349-363, 2003.
Tallapally et al., "Multivariate Synthesis of Tin Phosphide Nanoparticles: Temperature, Time, and Ligand Control of Size, Shape, and Crystal Structure," *Chem. Mater.* 28:5406-5414, 2016.
Tamhane, "Formation Of Lyotropic Liquid Crystals Through The Self-assembly Of Bile Acid Building Blocks," Master Thesis, University of Central Florida, Orlando, Florida, 2009, 93 pages.
Tanase et al., "Magnetic trapping and self-assembly of multicomponent nanowires," *Journal of Applied Physics* 91(10):8549-8551, 2002.

(56) References Cited

OTHER PUBLICATIONS

Tao et al., "Langmuir-Blodgett Silver Nanowire Monolayers for Molecular Sensing Using Surface-Enhanced Raman Spectroscopy," *Nano Letters* 3(9):1229-1233, 2003.

Tour et al., "Convenient route to di- and triorganosilyl ethyl ethers and the corresponding di- and triorganosilanes," *Journal of Organometallic Chemistry* 429:301-310, 1992.

Trimby, "Orientation mapping of nanostructured materials using transmission Kikuchi diffraction in the scanning electron microscope," *Ultramicroscopy* 120:16-24, 2012.

Tung et al., "Synthesis of Surfactant-free Aligned Single Crystal Copper Nanowires by Thermal-Assisted Photoreduction," *Crystal Growth & Design* 8(9):3415-3419, 2008.

Vairagar et al., "Direct evidence of electromigration failure mechanism in dual-damascene Cu interconnect tree structures," *Appl. Phys. Lett.* 87(081909):87-89, 2005.

Valeev et al., "Manufacturing Technology of Intra- and Interchip Interconnects for Modern ULSIs: Review and Concepts of Development," *Russian Microelectronics* 44(3):154-172, 2015.

Venkatesan et al., "A High Performance 1.8V, 0.20 µm CMOS Technology with Copper Metallization," International Electron Devices Meeting. IEDM Technical Digest, Dec. 10, 1997, Washington, DC, pp. 31.2.1-31.2.4.

Voronkov et al., "Properties and Transformations of The Si—H Bonds In Organosilicon Compounds," *Bulletin of the Academy of Sciences of the USSR, Division of chemical science* 31(5):939-957, 1982.

Wang et al., "Directed assembly of nanowires," *Materials Today* 12(5):34-43, 2009.

Wang et al., "Effect of oxygen plasma treatment on low dielectric constant carbon-doped silicon oxide thin films," *Thin Solid Films* 473:132-136, 2005.

Wang et al., "Ultrathin Au Nanowires and Their Transport Properties," *J. Am. Chem. Soc.* 130:8902-8903, 2008.

Wayner et al., "Organic modification of hydrogen terminated silicon surfaces," *J. Chem. Soc., Perkin Trans.* 2:23-24, 2002.

Wetzig et al., "In-situ study of interconnect failures by electromigration inside a scanning electron microscope," *AIP Conference Proceedings* 491:89-99, 1999.

Xu et al., "Conducting Performance of Individual Ag@C Coaxial Nanocables: Ideal Building Blocks for Interconnects in Nanoscale Devices," *Small* 5(4):460-465, 2009.

Xu et al., "Copper Nanowires as Nanoscale Interconnects: Their Stability, Electrical Transport, and Mechanical Properties," *ACSNANO* 9(1):241-250, 2015.

Yan et al., "Hybrid metal-organic chalcogenide nanowires with electrically conductive inorganic core through diamondoid-directed assembly," *Nature Materials* 16:349-357, 2017.

Yan et al., "Hybrid metal-organic chalcogenide nanowires with electrically conductive inorganic core through diamondoid-directed assembly," *Nature Materials*, supplementary materials, 18 pages, 2016.

Yang et al., "A room-temperature environmentally friendly solution process to assemble silver nanowire architectures for flexible transparent electrodes," *Nanoscale* 9:52-55, 2017.

Yang et al., "Investigation of low dielectric carbon-doped silicon oxide films prepared by PECVD using methyltrimethoxysilane precursor," *This Solid Films* 506-507:50-54, 2006.

Yao et al., "High-Field Electrical Transport in Single-Wall Carbon Nanotubes," *Physical Review Letters* 84(13):2941-2944, 2000.

Ye et al., "A rapid synthesis of high aspect ratio copper nanowires for high-performance transparent conducting films," *ChemComm* 50(20):2549-2684, 2014.

Ye et al., "How Copper Nanowires Grow and How To Control Their Properties," *Acc. Chem. Res.* 49:442-451, 2016.

Ye et al., "Integrating Nanowires With Substrates Using Directed Assembly and Nanoscale Soldering," *IEEE Transactions on Nanotechnology* 5(1):62-66, 2006.

Ye et al., "Real-Time Visualization of Diffusion-Controlled Nanowire Growth in Solution," *Nano Letters* 14:4671-4676, 2014.

Ye et al., "Real-Time Visualization of Diffusion-Controlled Nanowire Growth in Solution," *Nano Letters*, Supporting Information, 2014, 19 pages.

Ye et al., "The Role of Cuprous Oxide Seeds in the One-Pot and Seeded Syntheses of Copper Nanowires," *Small* 10(9):1771-1778, 2014.

Yoo et al., "Magnetically assembled 30 nm diameter nickel nanowire with ferromagnetic electrodes," *Nanotechnology* 17:2512-2517, 2006.

Zach et al., "Molybdenum Nanowires by Electrodeposition," *Science* 290(5499):2120-2123, 2000.

Zareyee et al., "A novel and highly efficient method for the silylation of alcohols with hexamethyldisilazane (HMDS) catalyzed by recyclable sulfonic acid-functionalized ordered nanoporous silica," *Tetrahedron Letters* 48:1277-1280, 2007.

Zhou et al., "CdSe nanowires with illumination-enhanced conductivity: Induced dipoles, dielectrophoretic assembly, and field-sensitive emission," *Journal of Applied Physics* 101(073704): 2007, 10 pages.

Zhuravlev, "Concentration of Hydroxyl Groups on the Surface of Amorphous Silicas," *Langmuir* 3:316-318, 1987.

\* cited by examiner

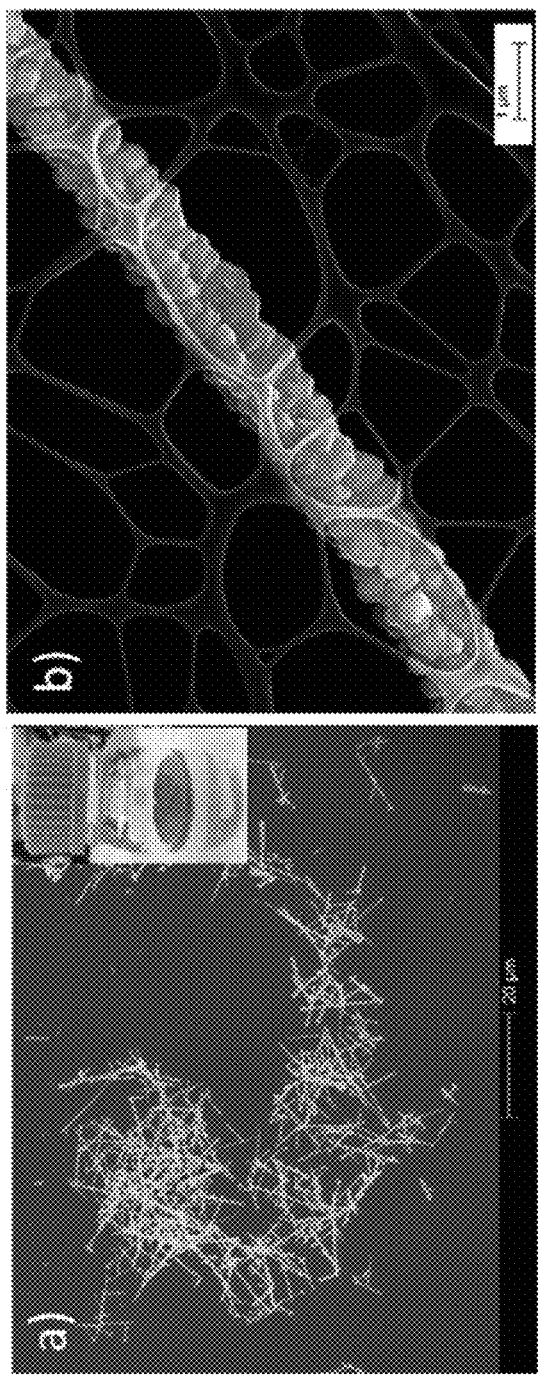
FIG. 1A
FIG. 1B
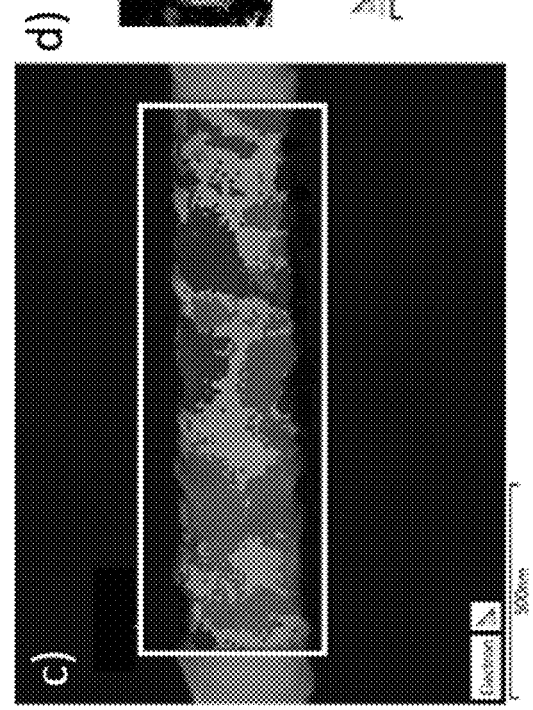
FIG. 1C
FIG. 1D

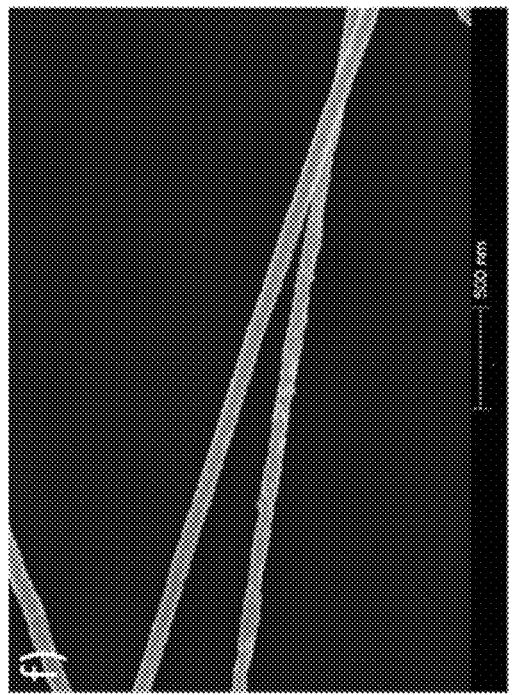
FIG. 1E
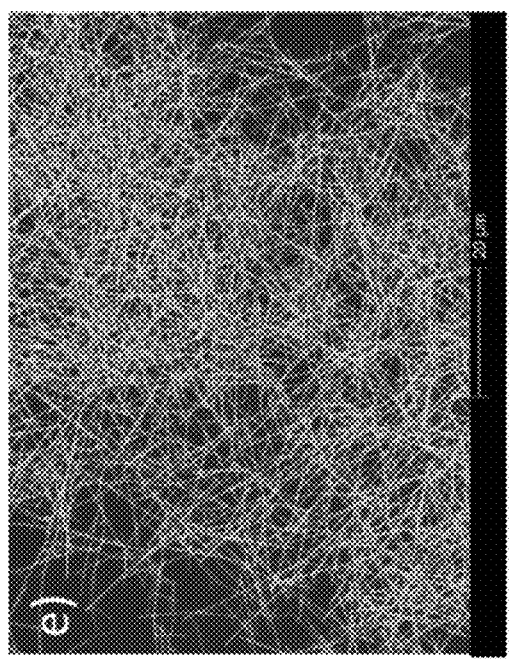
FIG. 1F
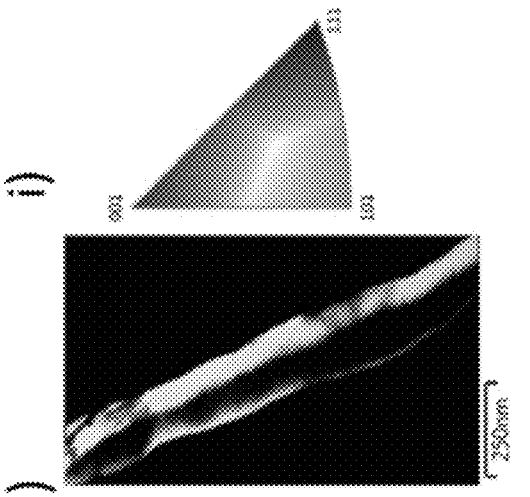
FIG. 1H
FIG. 1I
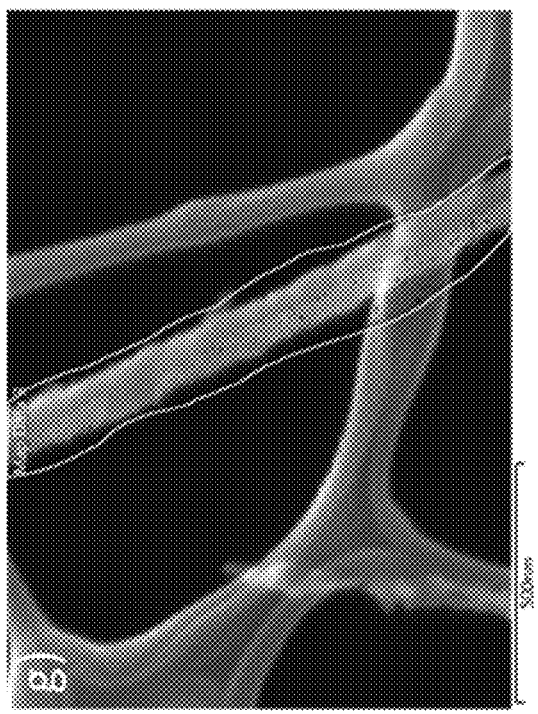
FIG. 1G

Magnetic field direction

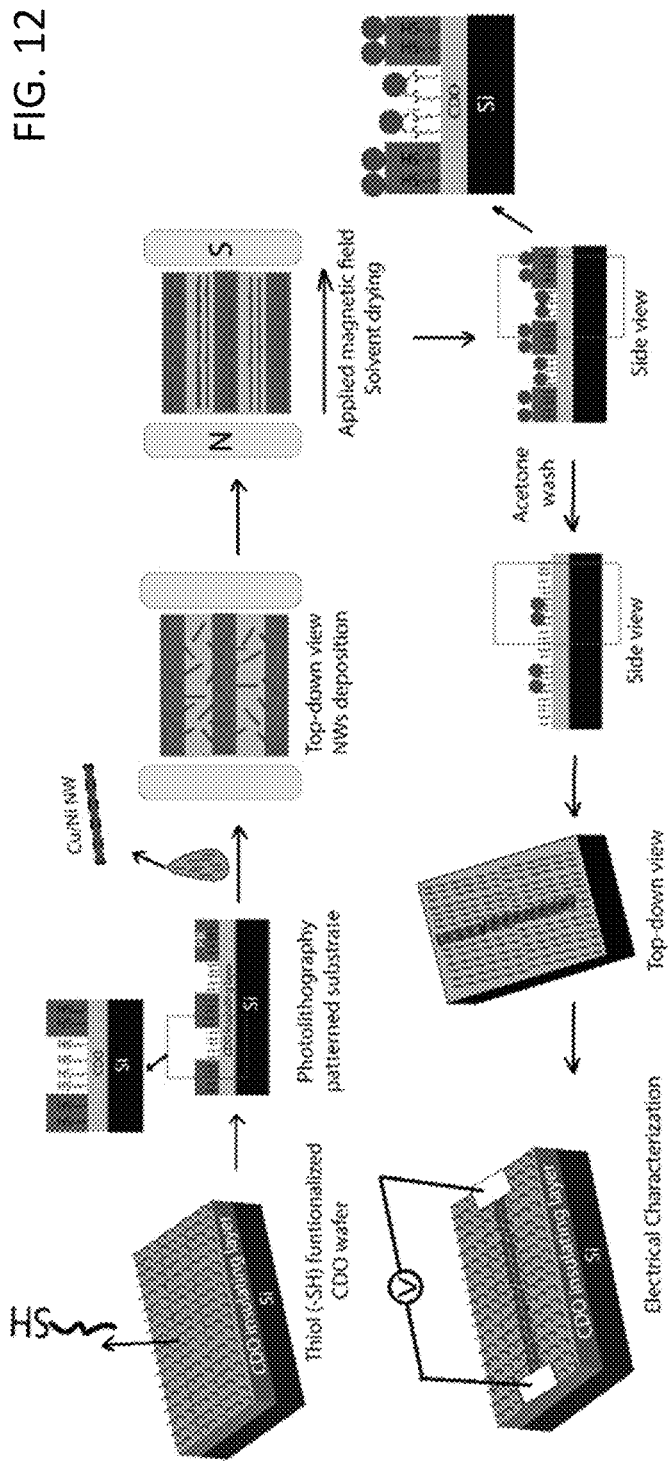
FIG. 12
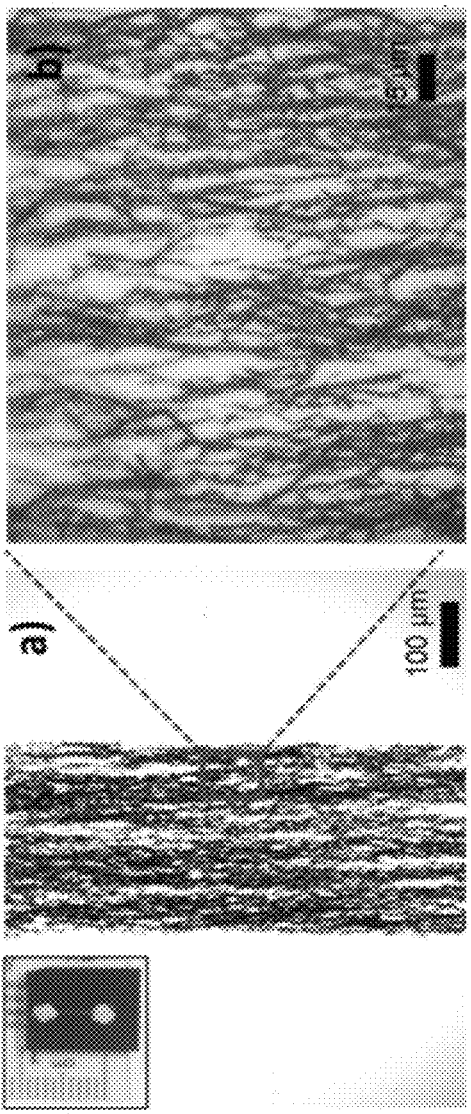
FIG. 13A
FIG. 13B

FIG. 14A
FIG. 14B
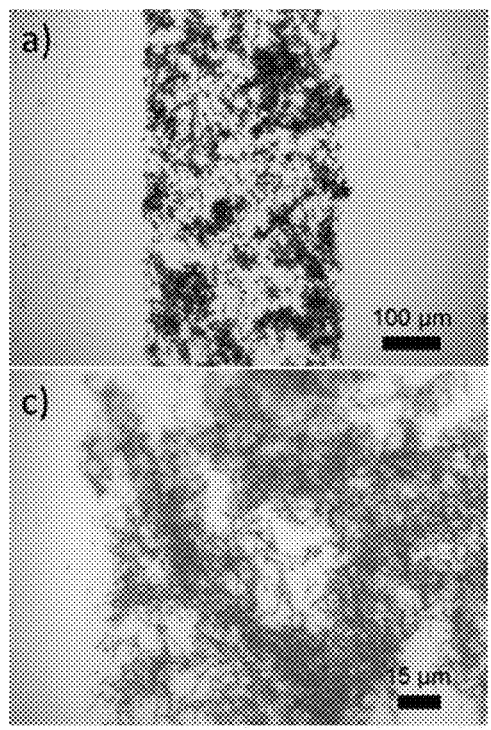
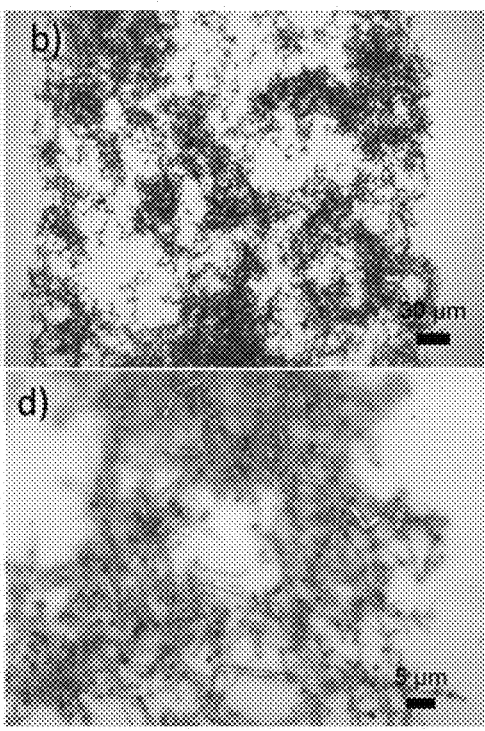
FIG. 14C
FIG. 14D
FIG. 15A
FIG. 15B
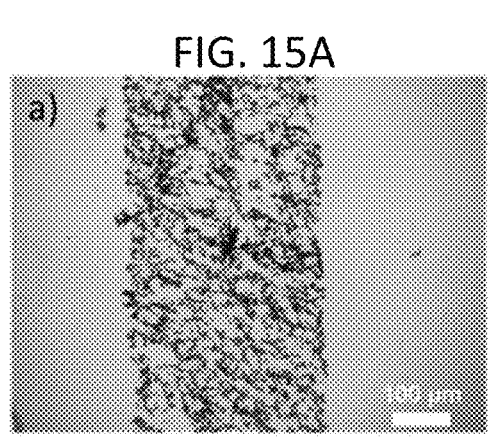
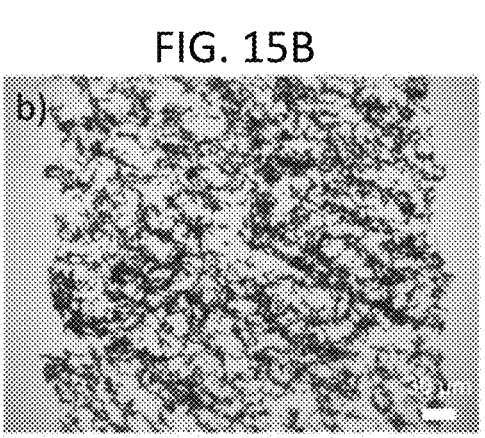
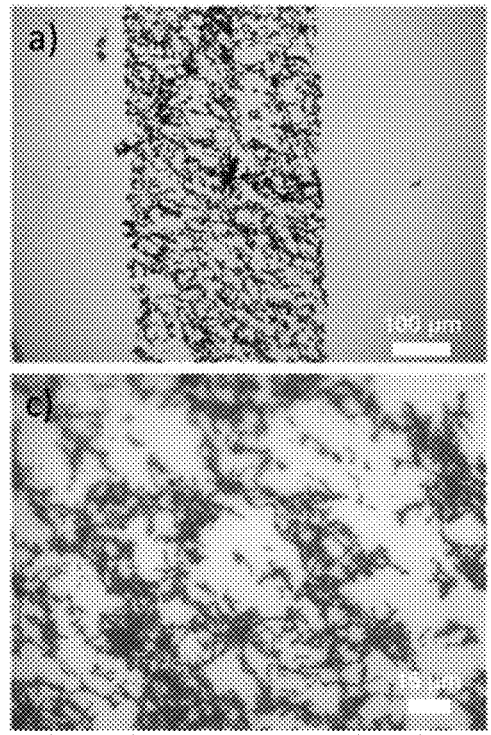
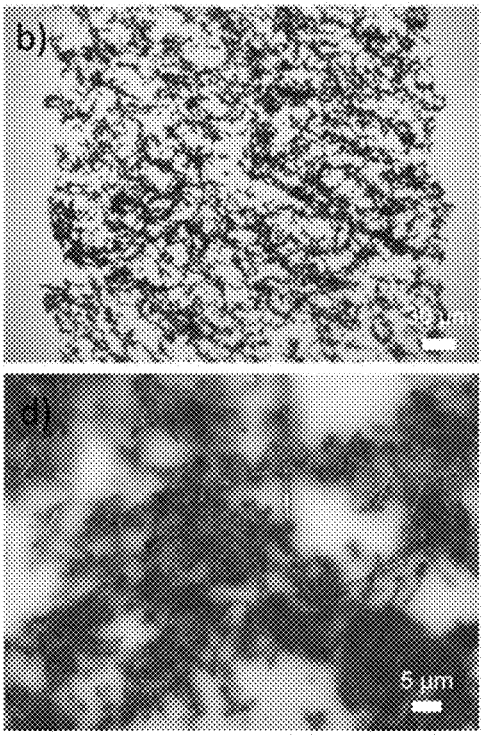
FIG. 15C
FIG. 15D

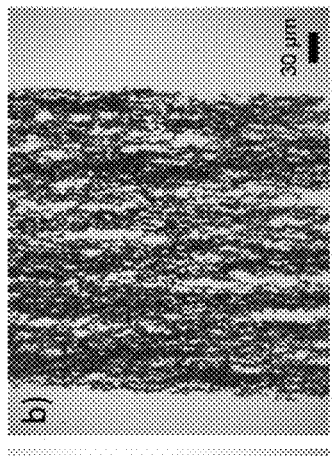
FIG. 16A
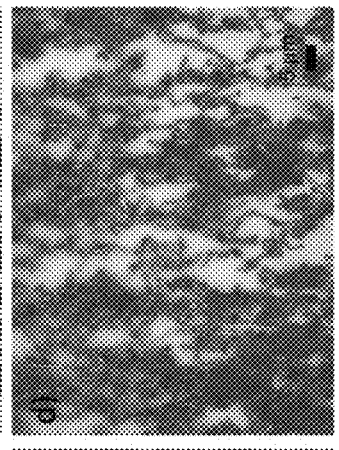
FIG. 16B
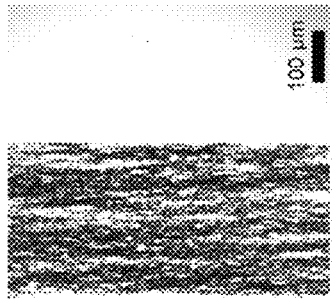
FIG. 16C
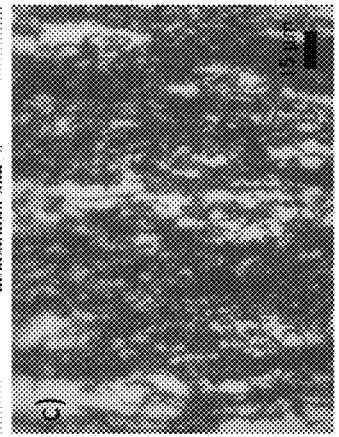
FIG. 16D
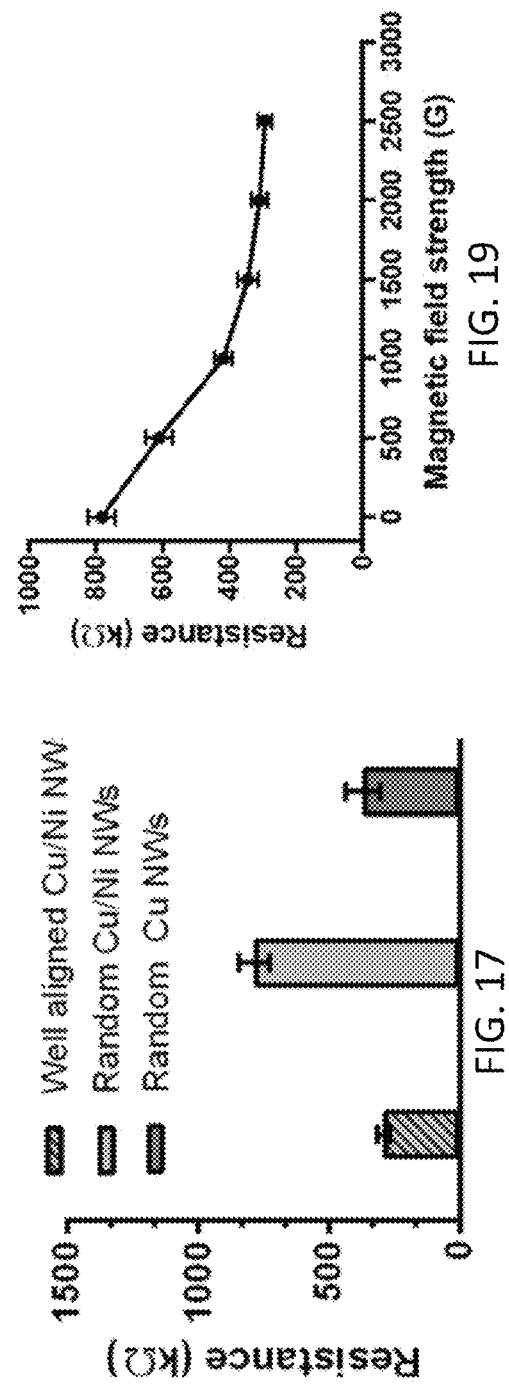
FIG. 19
FIG. 17

Scale bar = 50 μm

NANOWIRES WITH MAGNETIC COATINGS AND METHODS FOR MAKING AND USING

CROSS-REFERENCE TO RELATED APPLICATION

This application claims the benefit of the earlier filing date of U.S. provisional application No. 62/747,053, filed Oct. 17, 2018, which is incorporated by reference herein in its entirety.

FIELD

This disclosure concerns coated nanowires comprising a core and a ferromagnetic coating. The coated nanowires are magnetically aligned and bound to a substrate.

SUMMARY

Embodiments of magnetic coated nanowires (NWs) are disclosed. Methods of making and magnetically aligning the coated NWs are disclosed, along with uses for the magnetically aligned NWs.

Embodiments of a method for magnetically aligning coated NWs include: (i) providing a substrate comprising a thiol-functionalized surface; (ii) depositing a solution comprising a plurality of coated nanowires and a solvent onto the thiol-functionalized surface of the substrate, the coated nanowires comprising a nanowire core and a ferromagnetic coating on the nanowire core; (iii) applying a homogeneous directional magnetic field for an effective period of time to align at least some of the coated nanowires in the direction of the magnetic field; and (iv) evaporating the solvent while applying the directional magnetic field, whereby the aligned coated nanowires bind to the thiol-functionalized surface of the substrate. In some embodiments, the directional magnetic field is applied parallel or perpendicular to the substrate surface and the coated nanowires.

In some embodiments, the nanowire cores are prepared by reduction of a metal salt in solution in the presence of a reducing agent and growth-directing agent. In some embodiments, the NW cores have an average length of at least 5 μm, an average diameter ≤300 nm, an aspect ratio ≥20, a surface roughness ≤20 nm, or any combination thereof. In any or all embodiments, the ferromagnetic coating may have a thickness of from 1-30 nm. The NW cores may be partially or completely coated with the ferromagnetic coating.

Embodiments of the disclosed magnetically aligned coated NWs are useful in electronic and solar devices, among others. Exemplary components and devices include, but are not limited to, an integrated circuit, a transparent heater, or a solar cell.

The foregoing and other objects, features, and advantages of the invention will become more apparent from the following detailed description, which proceeds with reference to the accompanying figures.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 1A-1I show copper nanowires (NWs) synthesized with varying concentrations of hydrazine. FIGS. 1A and 1B, respectively, are low-magnification and high-magnification scanning electron microscopy (SEM) images of Cu NWs synthesized in the presence of $9.66 \times 10^{-3}$ M hydrazine. The inset in FIG. 1A is a photograph showing a Cu NW cake floating at the air-water interface. FIGS. 1C and 1D are orientational mapping inverse pole figures (IPFs) of the Cu NWs of FIGS. 1A and 1B. FIGS. 1E and 1F respectively, are low-magnification and high-magnification SEM images of Cu NWs synthesized in the presence of $5.73 \times 10^{-3}$ M hydrazine. FIGS. 1G and 1H are IPFs of the Cu NWs of FIGS. 1E and 1F. FIG. 1I shows the IPF color key.

FIG. 12 schematically depicts a process flow for spatially selective placement of Cu/Ni NWs.

FIGS. 13A and 13B are low and high magnification optical micrographs, respectively, of a unidirectionally aligned Cu/Ni NWs interconnect channel fabricated by depositing 0.5 mg/mL of NWs solution on a patterned CDO substrate. Inset image in FIG. 13A depicts a 4 mm long and 300 μm wide NW channel with silver ink contact pads on both ends of the channel.

FIGS. 14A-14D show randomly aligned Cu NWs deposited in a lithographically patterned channel on a thiol-derivatized CDO substrate at varying magnifications.

FIGS. 15A-15D show randomly aligned Cu/Ni NWs deposited in a lithographically patterned channel on a thiol-derivatized CDO substrate at varying magnifications.

FIGS. 16A-16D show magnetically aligned Cu/Ni NWs deposited in a lithographically patterned channel on a thiol-derivatized CDO substrate at varying magnifications.

FIG. 17 is a graph showing the resistance of magnetically aligned Cu/Ni NWs (left bar), random Cu/Ni NWs (central bar), and random Cu NWs placed in a channel (right bar).

FIG. 19 is a graph showing resistance of Cu/Ni NWs in channels prepared by solvent evaporation in magnetic field strengths varying from 0-2500 G.

DETAILED DESCRIPTION

Figure 2:
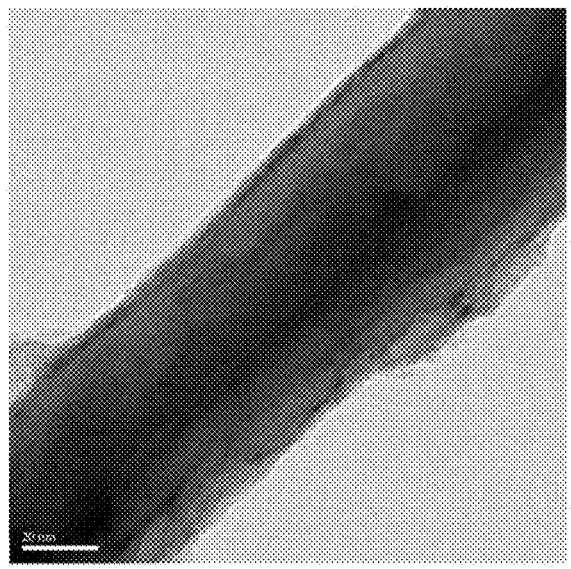
FIG. 2 is a transmission electron microscopy (TEM) image of a Cu NW synthesized in the presence of $5.73 \times 10^{-3}$ M hydrazine.

This disclosure concerns nanowires (NWs) with magnetic coatings, as well as devices and components including magnetically aligned coated NWs. Methods of making the devices and components, and uses thereof, are also disclosed.

I. Definitions

The following explanations of terms and abbreviations are provided to better describe the present disclosure and to guide those of ordinary skill in the art in the practice of the present disclosure. As used herein, "comprising" means "including" and the singular forms "a" or "an" or "the" include plural references unless the context clearly dictates otherwise. The term "or" refers to a single element of stated alternative elements or a combination of two or more elements, unless the context clearly indicates otherwise.

Unless explained otherwise, all technical and scientific terms used herein have the same meaning as commonly understood to one of ordinary skill in the art to which this disclosure belongs. Although methods and materials similar or equivalent to those described herein can be used in the practice or testing of the present disclosure, suitable methods and materials are described below. The materials, methods, and examples are illustrative only and not intended to be limiting. Other features of the disclosure are apparent from the following detailed description and the claims.

The disclosure of numerical ranges should be understood as referring to each discrete point within the range, inclusive of endpoints, unless otherwise noted. Unless otherwise indicated, all numbers expressing quantities of components, molecular weights, percentages, temperatures, times, and so forth, as used in the specification or claims are to be understood as being modified by the term "about." Accordingly, unless otherwise implicitly or explicitly indicated, or unless the context is properly understood by a person of ordinary skill in the art to have a more definitive construction, the numerical parameters set forth are approximations that may depend on the desired properties sought and/or limits of detection under standard test conditions/methods as known to those of ordinary skill in the art. When directly and explicitly distinguishing embodiments from discussed prior art, the embodiment numbers are not approximates unless the word "about" is recited.

Although there are alternatives for various components, parameters, operating conditions, etc. set forth herein, that does not mean that those alternatives are necessarily equivalent and/or perform equally well. Nor does it mean that the alternatives are listed in a preferred order unless stated otherwise.

Definitions of common terms in chemistry may be found in Richard J. Lewis, Sr. (ed.), *Hawley's Condensed Chemical Dictionary*, published by John Wiley & Sons, Inc., 1997 (ISBN 0-471-29205-2).

In order to facilitate review of the various embodiments of the disclosure, the following explanations of specific terms are provided:

Aspect ratio: As used herein, the term "aspect ratio" refers to a ratio of average length to average diameter.

Barrier layer: A layer deposited between a substrate surface and a metal nanowire to reduce or prevent interaction between the metal and the substrate material, e.g., diffusion of copper into silicon. Exemplary barrier layers include tantalum (Ta), tantalum (V) oxide ($Ta_2O_5$), and titanium nitride (TiN).

Electroless deposition: A non-galvanic, chemical deposition process performed without the use of external electrical power.

Ferromagnetic: Susceptible to magnetization by exposure to an applied magnetic field, which may persist after removal of the applied field.

Integrated circuit: A set of electronic circuits on a substrate. The electronic circuits may include elements such as resistors, transistors, diodes, capacitors, and the like, with interconnects connecting the elements.

Interconnect: A conductor, typically a line conductor, connecting elements of an integrated circuit.

Nanowire: A nanostructure having a diameter of less than 300 nm.

Transparent heater: A device comprising a visually transparent substrate with electrically conductive surface features. When current flows cross the electrically conductive surface features, heat is generated.

II. Magnetically Coated Nanowires and Synthesis

Embodiments of the disclosed magnetically coated nanowires (NWs) include a nanowire core and a ferromagnetic coating. The core may be a metal or nonmetal core. Exemplary NW core materials include, but are not limited to, copper, silver, silicon, and carbon nanotubes. In some examples, the NW core is copper.

In some embodiments, the NWs have an average length within a range of at least 5 μm, such as an average length within a range of 5-50 μm, 5-40 μm, 10-40 μm, or 20-40 μm. In any or all embodiments, the NW cores may have an average diameter ≤300 nm, such as an average diameter within a range of 125-300 nm, 125-250 nm, 125-200 nm or 150-200 nm. In any or all embodiments, the NW cores may have an aspect ratio (length/diameter) ≥20, such as an aspect ratio with a range of 20-325, 25-300, 50-300, 100-300, 150-300, or 200-300.

Advantageously, the NW cores have a smooth external surface (see, e.g., FIG. 1F). Roughness or smoothness may be qualitatively determined by SEM imaging and/or quantitatively determined, e.g., by Kikuchi patterns or orientational mapping inverse pole figures. A rough NW core may have an appearance resembling a cob of corn (see, e.g., FIG. 1B) with attached nanoparticles appearing as kernels on surface. A rough NW core may have a vertical roughness of, for example, 50-100 nm (FIGS. 1C, 1D), where roughness is the distance from the average surface to an upper surface of adhered nanoparticles. In contrast, a smooth NW core as disclosed herein may have a vertical roughness of ≤20 nm and be devoid, or substantially devoid, of attached nanoparticles (FIGS. 1G, 1H).

Embodiments of the disclosed coated nanowires comprise a ferromagnetic coating on the NW core. The ferromagnetic coating may comprise any ferromagnetic metal or oxide. In some embodiments, the ferromagnetic coating is nickel, cobalt, iron, iron oxide, or a combination thereof. In certain examples disclosed herein, the NW core is copper and the ferromagnetic coating is nickel.

In some embodiments, the ferromagnetic coating has an average thickness within a range of 1-30 nm, such as a thickness of 1-25 nm. In some examples, the ferromagnetic coating may have a thickness of 10-25 nm. In other examples, the ferromagnetic coating may be much thinner, such as a coating having a thickness of 1-10 nm, such as a thickness of 1-5 nm, or even 1-2 nm. In any or all embodiments, the coated NW may be completely coated with the ferromagnetic coating. In some embodiments, the coated NW is only partially coated with the ferromagnetic coating. In certain examples, the coated NW is initially completely coated with the ferromagnetic coating, and at least a portion of the ferromagnetic coating is removed from the NW core after the coated NW has been bound to a substrate as described below. For instance, the ferromagnetic coating may be removed from surfaces of the coated NW that are not bound to the substrate and/or in physical contact with another coated NW.

In some embodiments, the NW core is copper. The NWs may be synthesized by reducing copper ions in aqueous solution to form elemental copper. The aqueous solution comprises a water-soluble copper salt, a reducing agent, and growth-directing or capping agent. Suitable reducing agents include, but are not limited to, hydrazine. Suitable growth-directing or capping agents include, but are not limited to, ethylenediamine.

The chemical reactions involved in Cu NWs synthesis are shown below. In an aqueous solution, cupric ($Cu^{2+}$) ions react with hydroxyl ($OH^-$) ions and form cupric hydroxide complex ions (see eq-1). A reducing agent, hydrazine, supplies electrons that are required for the reduction of cupric ions to copper ($Cu(0)$). In the first step of the reduction process, cupric hydroxide ($Cu^{2+}$) complex ions are reduced to cuprous ($Cu^+$) hydroxyl complex ions, (see eq-3). In the second step, as cuprous ion complexes ($Cu^+$) are reduced to metallic copper ($Cu^0$), (see eq-4), a capping or growth directing agent (e.g., ethylenediamine), directs the copper atoms into unidirectional growth to form nanowire morphology.

$$Cu^{2+}+4OH^-\rightarrow Cu(OH)_4^{2-} \text{ (blue solution)} \quad (1)$$

$$N_2H_4+4OH^-\rightarrow N_2(g)+4H_2O+4e^- \quad (2)$$

$$2Cu(OH)_4^{2-}+2e^-\rightarrow 2Cu(OH)_2^- \text{ (clear solution)} \quad (3)$$

$$2Cu(OH)_2^-+2e^-\rightarrow 2Cu(0)+2OH^- \quad (4)$$

The nanowire morphology (e.g., length, diameter, aspect ratio, and surface smoothness) is determined, at least in part, by the reducing agent concentration. A high concentration of the reducing agent may keep the NW surface free of copper oxide and promote copper deposition onto the NW surface, resulting in adhered Cu nanoparticles and a rough surface. A reducing agent concentration that is too low, however, may provide a small yield and increase polydispersity. In some embodiments, the reducing agent is hydrazine and a concentration of hydrazine in the reaction is $4\times10^{-3}$ M to $1\times10^{-2}$ M. Alternatively, the reaction may include a molar ratio of hydrazine to metal ions of from 10:1 to 25:1.

The NW size is also influenced by temperature. In general, as temperature increases, the average nanowire length decreases and the average diameter increases, resulting in a decreasing aspect ratio. In some embodiments, the synthesis is performed at a temperature within a range of from 60° C. to 90° C., such as a temperature of 60-80° C. or 65-75° C. The reaction is allowed to proceed for an effective amount of time to form NWs having a desired length and/or diameter, or until the solution is depleted of copper ions and further NW formation and growth ceases. In general, longer reaction times produce longer NWs, until such time as the copper ions are depleted. In any or all embodiments, the effective period of time may be at least 20 minutes, such as from 20-60 minutes, 20-45 minutes, or 25-40 minutes.

In some embodiments, the nanowire cores are copper or silver, and the nanowire cores are synthesized by (a) preparing an aqueous solution comprising a copper (II) or silver (I) salt and a base, the copper (II) or silver (I) salt providing copper or silver ions in the aqueous solution; (b) adding a growth directing agent and a reducing agent to the aqueous solution and mixing the resulting solution; (c) maintaining the resulting solution at a temperature within a range of 60-90° C. for an effective period of time to reduce the copper or silver ions and form copper or silver nanowire cores; and (d) collecting the copper or silver nanowire cores. In any or all embodiments, the growth directing agent may be ethylenediamine (EDA). The resulting solution may include 0.4-0.8 mM EDA, such as 0.5-0.7 mM EDA. In any or all embodiments, the reducing agent may be hydrazine, and the resulting solution may comprise $4\times10^{-3}$ M to $1\times10^{-2}$ M hydrazine, such as $5\times10^{-3}$ M to $1\times10^{-2}$ M, $5\times10^{-3}$ M to $8\times10^{-3}$ M or $5\times10^{-3}$ M to $7\times10^{-3}$ M hydrazine. Alternatively, the resulting solution may have a metal ion to hydrazine molar ratio within a range of from 2:1 to 0.25:1, such as a molar ratio of from 1:1 to 0.3:1 or 1:1 to 0.5:1. In some embodiments, the temperature is 60-80° C. or 65-75° C. In any or all embodiments, the effective period of time may be at least 20 minutes, such as 20-60 minutes or 20-40 minutes. In certain examples, the effective period of time is 30 minutes. In on embodiment, the nanowire cores are copper, and the aqueous solution comprises a copper (II) salt, such as $Cu(NO_3)_2$. In another embodiment, the nanowire cores are silver, and the aqueous solution comprises a silver salt, such as $AgNO_3$.

The synthesized NW cores are collected by any suitable method, e.g., centrifugation, filtration, or the like. The collected NW cores may be washed to remove contaminants. In some embodiments, the NW cores are washed with ethanol and deionized water. The nanowires may be stored in deoxygenated solution to prevent or minimize oxidation. For example, the NW cores may be stored in ethanol.

A ferromagnetic coating is applied to the NW cores. In some embodiments, the ferromagnetic coating is applied by electroless deposition. In some embodiments, the ferromagnetic coating comprises nickel, cobalt, iron, iron oxide, or a combination thereof, and the electroless deposition process includes (a) preparing an aqueous metal salt solution comprising a reducing agent and a metal salt, wherein the metal of the metal salt is nickel, cobalt, iron, or a combination thereof; (b) combining the aqueous metal salt solution with a suspension comprising nanowires and mixing to form a metal salt and nanowire suspension; (c) heating the metal salt and nanowire suspension at an effective temperature for an effective period of time to form nanowires coated with the metal; and (d) collecting the coated nanowires. In any or all embodiments, the metal salt and nanowire suspension may comprise 1.5-2.5 mM metal ions, such as 1.7-2.3 mM or 1.9-2.1 mM. In any or all embodiments, the metal salt and nanowire suspension may have a nanowire concentration of 0.1-5 mg/mL, such as 0.1-3 mg/mL, or 0.5-2 mg/mL. The metal salt and nanowires may be suspended in ethylene glycol. In any or all embodiments, the reducing agent may be hydrazine. In any or all embodiments, the effective temperature may be within a range of 100-150° C., such as a range of 100-120° C. In any or all embodiments, the effective period of time may be up to 10 minutes, such as within a range of 7-10 minutes. In one embodiment, the ferromagnetic coating is nickel and the metal salt is $Ni(NO_3)_2$. In another embodiment, the ferromagnetic coating is cobalt and the metal salt is $Co(NO_3)_2$.

The coated NWs may be collected by any suitable method, e.g., centrifugation, filtration, or the like. The coated NWs may be washed and stored prior to use. For example, the coated NWs may be stored in deoxygenated solution (e.g., ethanol) to prevent or minimize oxidation. Just prior to use, the coated NWs may be collected, such as by centrifugation, and transferred into deionized water.

III. Magnetic Alignment

Embodiments of the disclosed coated NWs are suitable for deposition and magnetic alignment on a substrate. In some embodiments, the process comprises providing a substrate comprising a thiol-functionalized surface; depositing a solution comprising a plurality of coated nanowires and a solvent onto the thiol-functionalized surface of the substrate, the coated nanowires comprising a nanowire core and a ferromagnetic coating on the nanowire core; applying a homogeneous directional magnetic field to the substrate and the coated nanowires for an effective period of time to align at least some of the coated nanowires in the direction of the magnetic field; and evaporating the solvent while applying the directional magnetic field, whereby the aligned coated nanowires bind to the thiol-functionalized surface of the substrate. Without wishing to be bound to a particular theory of operation, the nature of the metal-sulfur bonds may be partially electrostatic and partially covalent. In some embodiments, the homogeneous directional magnetic field is applied parallel or perpendicular to the substrate surface and the coated nanowires. The aligned coated NWs may have an average alignment angle within a range of 0-20°, such as 4-20°, 4-15°, or 4-12° (e.g., relative to the direction of the magnetic field applied during formation of the device or device component and/or relative to an average orientation of a plurality of the NWs on the substrate; see, for example FIG. 8B).

In any or all embodiments, the ferromagnetic coating may have an average thickness within a range of from 1-30 nm and: (i) the directional magnetic field has a strength of at least 1000 gauss; or (ii) the effective period of time for applying the directional magnetic field is at least 10 seconds; or (iii) both (i) and (ii). In some embodiments, the magnetic field has a strength of 1000-30,000 gauss, 1000-25,000 gauss, 10000-20,000 gauss, 10000-15,000 gauss, 1000-10,000 gauss, 1000-5000 gauss, 1000-3000 gauss, 1500-3000 gauss, or 2000-3000 gauss. The effective period of time may be 10 seconds to 20 minutes, such as 15-seconds to 15 minutes, 30 seconds-15 minutes, 1-15 minutes, or 5-15 minutes.

In some embodiments, the thiol-functionalized surface of substrate comprises thiol-functionalized carbon-doped silicon oxide or thiol-functionalized silicon oxide. The thiol-functionalized surface of the substrate may be prepared by esterifying ≡Si—OH functional groups on a surface of the substrate to form triflate groups (≡Si—O-Tf); reducing the triflate groups to form ≡Si—H groups; and hydrosilylating the ≡Si—H groups with an alkenyl thiol to form ≡Si—$(CH_2)_x$—SH groups where x is an integer from 3 to 18. Thus, x may be 3, 4, 5, 6, 7, 8, 9, 10, 11, 12, 13, 14, 15, 16, 17, or 18, or any range within the end points of 3 and 18. In certain embodiments, the alkenyl thiol is 2-propene-1-thiol.

In any or all embodiments, the thiol-functionalized surface of the substrate may be patterned with a photoresist film, e.g., by lithographic masking/patterning, to provide one or more exposed regions of thiol groups and one or more regions covered with the photoresist film prior to depositing the solution comprising the plurality of coated nanowires onto the thiol-functionalized surface, whereby upon applying the directional magnetic field and evaporating the solvent, the aligned coated nanowires bind to the one or more exposed regions of thiol groups. In some embodiments, after the coated NWs are aligned and the solvent is evaporated, the method further comprises removing the photoresist film and unbound coated nanowires from the thiol-functionalized surface, whereby aligned coated nanowires remain bound to the one or more exposed regions, thereby providing a substrate having a surface comprising a first set of aligned coated nanowires bound to the substrate via thiol groups.

In some embodiments, it is desired to form a multilayer device including aligned coated NWs in more than one of the layers. In such embodiments, the method may further comprise (a) applying a photoresist film to the surface comprising the first set of aligned coated nanowires bound to the substrate; (b) patterning the photoresist film to provide exposed regions, the exposed regions including at least some exposed thiol groups not bound to aligned coated nanowires; (c) depositing a solution comprising a plurality of coated nanowires and a solvent onto the surface, the coated nanowires comprising a ferromagnetic coating; (d) applying a directional magnetic field to the substrate and the coated nanowires for an effective period of time to align at least some of the coated nanowires in the direction of the magnetic field; (e) evaporating the solvent while applying the directional magnetic field, whereby the aligned coated nanowires bind to the exposed thiol groups; (f) removing the photoresist film and unbound coated nanowires from the surface to provide a subsequent set of aligned coated nanowires bound to the substrate via thiol groups; and (g) optionally repeating steps (a)-(f) to provide one or more additional sets of aligned coated nanowires bound to the substrate. The additional sets may be aligned at different orientations and positions relative to one another.

In any or all embodiments, the method may further comprise, after evaporating the solvent, subsequently removing at least a portion of the ferromagnetic coating from an upper surface of the aligned coated nanowires. In some embodiments, the ferromagnetic coating is nickel and subsequently removing at least a portion of the ferromagnetic coating from an upper surface of the aligned coated nanowires comprises wet etching with an aqueous $FeCl_3$ solution at pH 6-8 at a temperature within a range of 0-10° C.

IV. Devices and Components

Embodiments of the disclosed magnetically aligned coated NWs are useful in solar or electronic devices or components of such devices. In some embodiments, a device or component of a device comprises a substrate comprising a thiol-functionalized surface and a plurality of aligned coated nanowires bound to the thiol-functionalized surface, each of the coated nanowires comprising a nanowire core and a ferromagnetic coating on at least a portion of the nanowire core. The coated NWs may be, for example, nickel-coated copper NWs. In some embodiments, the substrate comprises thiol-functionalized carbon-doped silicon oxide or thiol-functionalized silicon oxide.

In certain embodiments, (i) the nanowires have an average length within a range of 5-50 μm, or (ii) the nanowire cores have an average diameter within a range of 125-300 nm, or (iii) the nanowire cores have an aspect ratio within a range of 20-325, or (iv) the nanowire cores have a surface roughness ≤20 nm, or (v) the ferromagnetic coating has an average thickness within a range of 1-30 nm, or (vi) the aligned nanowires have an average alignment angle within a range of 0-20°, or (vii) any combination of (i), (ii), (iii), (iv), (v), and (vi).

In any or all embodiments, the thiol-functionalized surface, prior to binding the aligned coated nanowires, may comprise ≡Si—$(CH_2)_x$—SH groups where x is an integer from 3 to 18. In some embodiments, the thiol-functionalized surface, prior to binding the aligned coated nanowires, comprises ≡Si—$(CH_2)_3$—SH groups and a spacing between the substrate surface and a lower surface of the coated nanowires is 0.12 nm.

In some embodiments, the aligned coated nanowires are completely coated with the ferromagnetic coating. In other embodiments, at least a portion of an upper surface of the aligned coated nanowires is devoid of the ferromagnetic coating.

Advantageously, devices and components as disclosed herein do not require a barrier layer between the substrate surface and the aligned coated NWs. The absence of a barrier layer facilitates construction of thinner devices and components.

In any or all embodiments, the plurality of aligned coated nanowires may form one or more interconnects on the thiol-functionalized substrate surface. In some embodiments, the device or component is an integrated circuit, a transparent heater, or a solar cell.

V. EXAMPLES

Chemicals and Reagents: copper nitrate $(Cu(NO_3)_2$ 2.5 $H_2O$, ≥99.99%), ethylenediamine $(C_2H_8N_2$, 99+%, extra pure), hydrazine $(N_2H_4$, 35 wt % in $H_2O$), ethanol $(C_2H_5OH$, 99.99%), sodium hydroxide (NaOH, ≥98% pellets), ethylene glycol $(C_2H_6O_2$, ≥99%), and nickel nitrate $(Ni(NO_3)_2$ $6H_2O$, 99.99%) were used as received from Sigma Aldrich, without further purification.

Example 1

Nickel-Coated Copper Nanowire Synthesis and Characterization

Copper nanowires (NWs) were synthesized in a solution using ethylenediamine (EDA) as a growth directing agent and hydrazine as a reducing agent. In brief, copper nitrate $(Cu(NO_3)_2·2.5$ $H_2O)$ solution (0.1 M in deionized (DI) water, 2.0 mL) was mixed with freshly prepared aqueous NaOH (15 M, 40 mL) solution. Ethylenediamine (EDA, $C_2H_4(NH_2)_2$) (0.1 M, 266 μL) and varying concentrations of hydrazine ($9.66×10^{-3}$M (35 μL) to $4.09×10^{-3}$M (15 μL)) reagents were added followed by a thorough mixing for 3 and 2 min respectively after adding each reagent. Upon addition of hydrazine, the solution turned colorless suggesting reduction of copper ions. The clear solution was kept in hot water bath at 70° C. After 30 minutes, a reddish-brown cake floated up at the air-water interface above the clear solution. The NWs were collected and washed several times with DI water and ethanol in a centrifugation process, and finally stored in ethanol.

All reagent concentrations and conditions were maintained constant except hydrazine. Effects of high ($9.66×10^{-3}$M, 35 μL), intermediate ($8.28×10^{-3}$M, 30 μL), and low ($5.73×10^{-3}$M, 21 μL), hydrazine concentrations. Images of Cu NWs synthesized in high and low hydrazine concentrations are shown in FIGS. 1A-1I.

FIGS. 1A and 1B, respectively, are low-magnification and high-magnification scanning electron microscopy (SEM) images of Cu NWs synthesized in the presence of $9.66×10^{-3}$ M hydrazine. The inset in FIG. 1A is a photograph showing a Cu NW cake floating at the air-water interface. FIGS. 1A and 1B reveal a low aspect ratio (~20) and a rough surface resulting from nanoparticle decoration. To probe the NW morphology of particle decoration, crystallographic orientational mapping using transmitted electron backscattered diffraction (t-EBSD) technique was employed. The orientational mapping inverse pole figures (IPFs) demonstrated randomly oriented particles in the various crystallographic orientations (FIGS. 1C and 1D). In FIG. 1C, the IPF is overlaid on an SEM image. FIG. 1D shows out-of-plane (Z) direction t-EBSD crystallographic orientation. FIGS. 1C and 1D show thick and highly particle-decorated NWs.

FIGS. 1E and 1F respectively, are low-magnification and high-magnification SEM images of Cu NWs synthesized in the presence of $5.73×10^{-3}$ M hydrazine. At low hydrazine concentration ($5.73×10^{-3}$M, 21 μL), the synthesis yielded high aspect ratio (~250) NWs, with a particle-free smooth surface. The average length of the NWs was ~30±4 μm with a diameter of 120±20 nm. FIGS. 1G and 1H are IPFs of the Cu NWs of FIGS. 1E and 1F. Overlaid crystallographic orientation mapping on the SEM image (FIG. 1G), and out-of-plane (Z) direction t-EBSD crystallographic orientation (FIG. 1H) show thin and particle-free, high aspect ratio Cu NWs. FIG. 1I shows the inverse pole figure color key. The t-EBSD IPFs from the same batch of NWs, shown in FIGS. 1G and 1H, exhibited a comparatively smooth surface. The dark regions in the IPFs represent poorly transmitted electron signal due to high electron scattering in these regions. FIG. 2 is a low-magnification transmission electron microscopy (TEM) image of a Cu NW from the same batch, confirming the thin, smooth, and particle-free Cu NW surface. However, upon further reduction in the concentration of hydrazine to $4.09×10^{-3}$ M, the resulting NWs exhibited low yield with increased size polydispersity. Unlike the prior syntheses, the color of the reaction medium remained pale blue, which indicated the hydrazine concentration was insufficient to completely reduce the copper ion complexes into metallic copper.

Figure 3A:
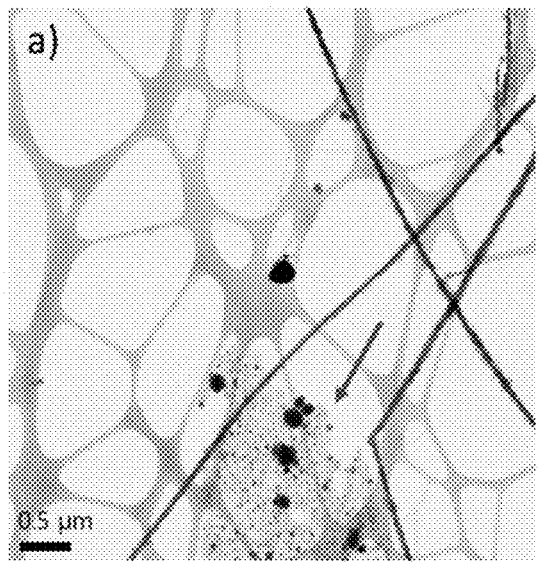
FIGS. 3A-3C are—magnification bright field (FIG. 3A), high magnification darkfield (FIG. 3B), and TEM (FIG. 3C) images of Cu NWs with adhered Cu nanoparticles (indicated with arrows); the Cu NWs were synthesized in the presence of $5.73 \times 10^{-3}$ M hydrazine.
Figure 3B:
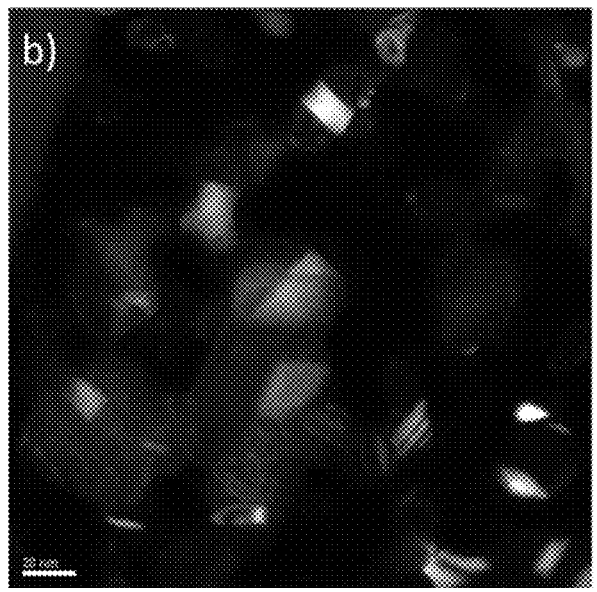
Figure 3C:
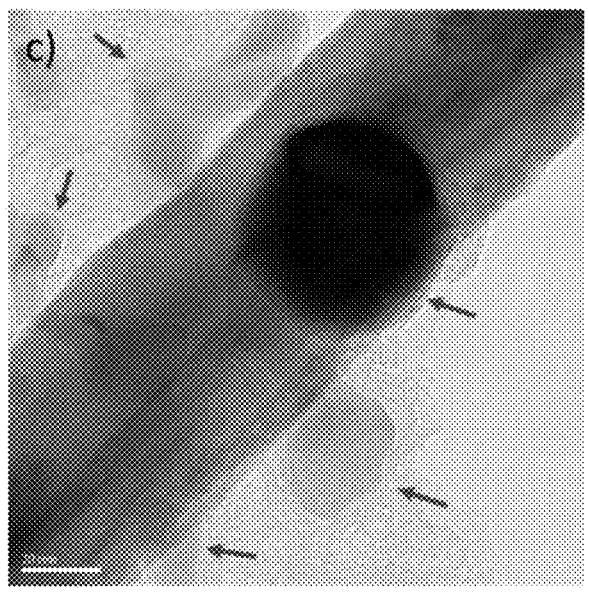

Without wishing to be bound by a particular theory of operation, EDA may act as a selective facet promoter of NW growth, as discussed by Kim et al. (*JACS* 2016, 139:277-284). High concentration of the reducing agent hydrazine could keep the NW surface free of Cu oxide and thereby promote the deposition of copper onto the NW surface. Such deposition of Cu nanoparticles would lead to rougher and thicker NWs. TEM images support this model (see, e.g., Ye et al., *Chem. Commun.* 2014, 50:2562). FIGS. 3A-3C are low-magnification bright field (FIG. 3A), high magnification darkfield (FIG. 3B), and high magnification (FIG. 3C) TEM images showing the presence of Cu nanoparticles (indicated with arrows) adhered to the surface of the Cu NW.

Figures 4A, 4B, 4C:
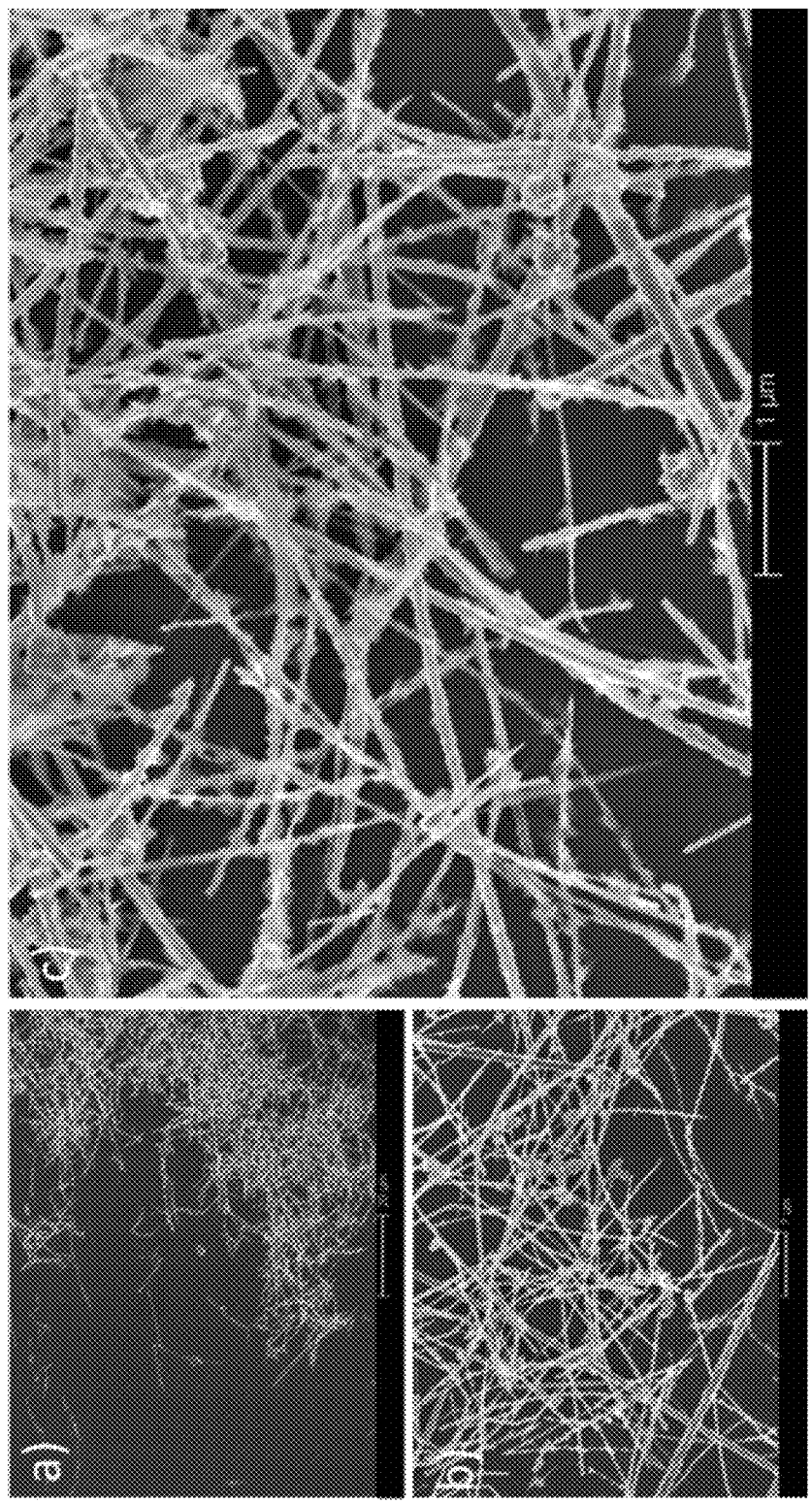
FIGS. 4A-4C are low (FIG. 4A), medium (FIG. 4B), and high (FIG. 4C) magnification SEM images of Cu NWs synthesized using intermediate hydrazine concentration ($8.28 \times 10^{-3}$ M).

At an intermediate concentration of hydrazine, the NW surface decoration with nanoparticle was suppressed. FIGS. 4A-4C are low-, medium- and high-magnification SEM images of Cu NWs synthesized with $8.28 \times 10^{-3}$ M hydrazine.

Table 1 shows the effects of synthesis temperature on the length, diameter, and aspect ratio of the Cu NWs. As shown in Table 1, as temperature increases, average length decreases, average diameter increases, and aspect ratio decreases. Higher synthesis temperatures generated smaller NWs due to oxidation of freshly nucleated copper NWs. It is possible to control both aspect ratio and surface roughness of Cu NWs by controlling the synthesis temperature and hydrazine concentration.

TABLE 1

| Temp. (° C.) | Average Length (μm) | Average Diameter (nm) | Aspect ratio |
|---|---|---|---|
| 60 | 32 ± 7 | 160 ± 30 | 200 |
| 70 | 25 ± 6 | 170 ± 50 | 147 |
| 80 | 15 ± 4 | 210 ± 60 | 71 |
| 90 | 7 ± 2 | 215 ± 35 | 32 |

Electroless coating of nickel onto Cu NWs was performed as follows. $Ni(NO_3)_2$ (0.1 M in DI water, 0.4 mL) and hydrazine (0.16 M (600 μL)) reagents were mixed into a 10 mg of Cu NWs (dry mass) suspension in ethylene glycol (20 mL). The solution was thoroughly mixed for 5 minutes to make a homogeneous solution and heated on a hotplate at 150° C. After heating for 10 minutes, the solution turned to clear and dark colored nickel coated Cu NWs (Cu/Ni NWs) floated at the air-water interface due to trapped $N_2$ gas bubbles generated in the reaction mixture.

Figure 5A:
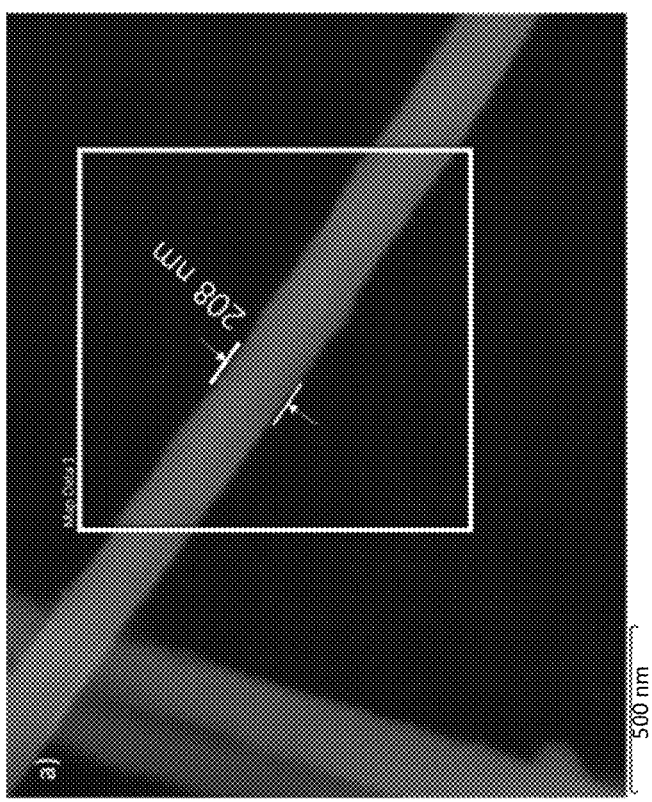
FIGS. 5A and 5B, respectively are an SEM image of nickel-coated Cu NWs and an elemental mapping image obtained by energy dispersive X-ray spectroscopy showing the copper core and nickel coating.
Figure 5B:
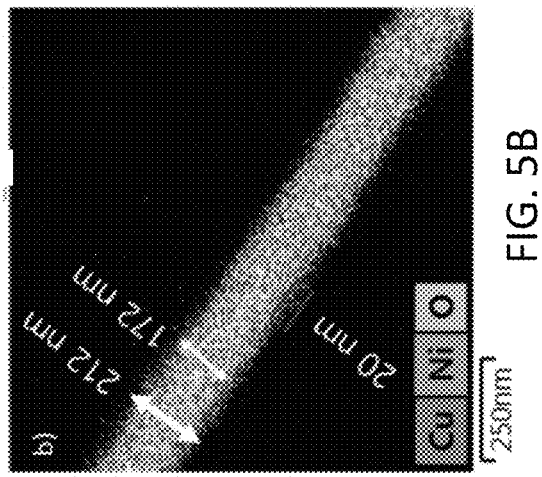
Figure 6:
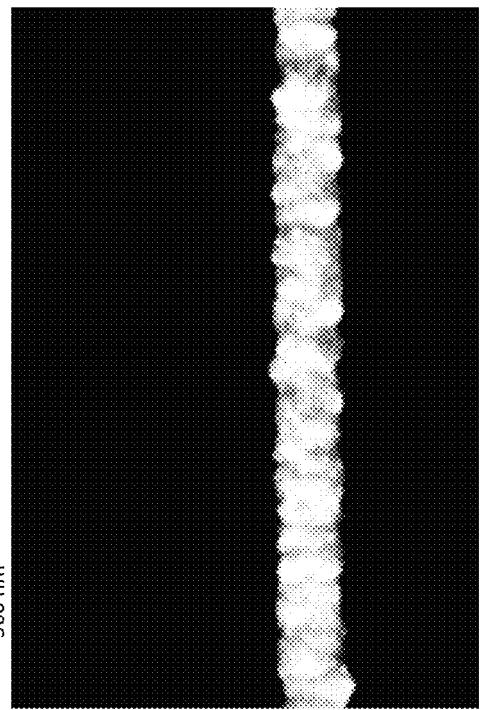
FIG. 6 is a high magnification (93.54 kx) SEM image of a Cu/Ni NW.

Morphology was investigated by using an FEI Sirion XL30 FEG scanning electron microscope (SEM). Transmitted electron backscattered diffraction (t-EBSD) orientational mapping images were collected using a Zeiss Sigma VP FEG SEM equipped with EBSD detector. t-EBSD data was collected by holding the Cu NWs loaded TEM grid close to the pole piece using a custom-made sample holder. Transmission electron microscope (TEM) images were captured using an FEI Tecnai F20 TEM/STEM. Optical micrographs were captured using an Olympus BX51 upright microscope. FIGS. 5A and 5B, respectively are an SEM image of the nickel-coated Cu NWs and an elemental mapping image obtained by energy dispersive X-ray spectroscopy (EDS) showing the copper core and nickel coating. The EDS mapping shows that the nickel layer had an average thickness of ~20-30 nm. An oxygen layer between the copper and nickel layers was noted. The oxygen layer may be due to surface oxidation of copper while cleaning the synthesized Cu NWs in an aqueous solution. FIG. 6 is a high magnification (93.54 kx) SEM image of a Cu/Ni NW.

Figure 7:
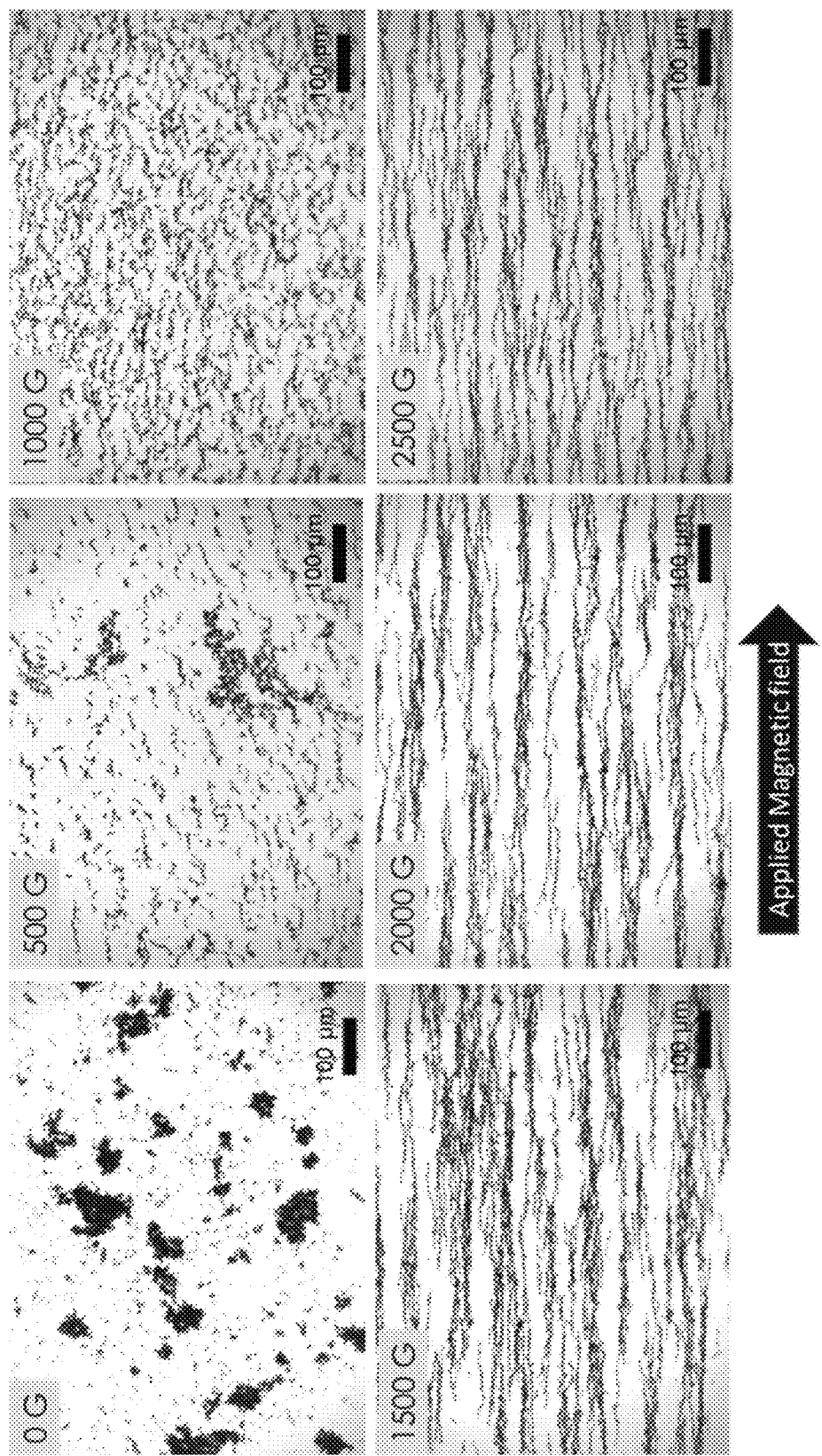
FIG. 7 is a series of reflectance optical micrographs showing increasing alignment and chain formation of Ni-coated Cu NWs as an applied magnetic field was increased from 0 gauss to 2500 gauss.
Figure 8A:
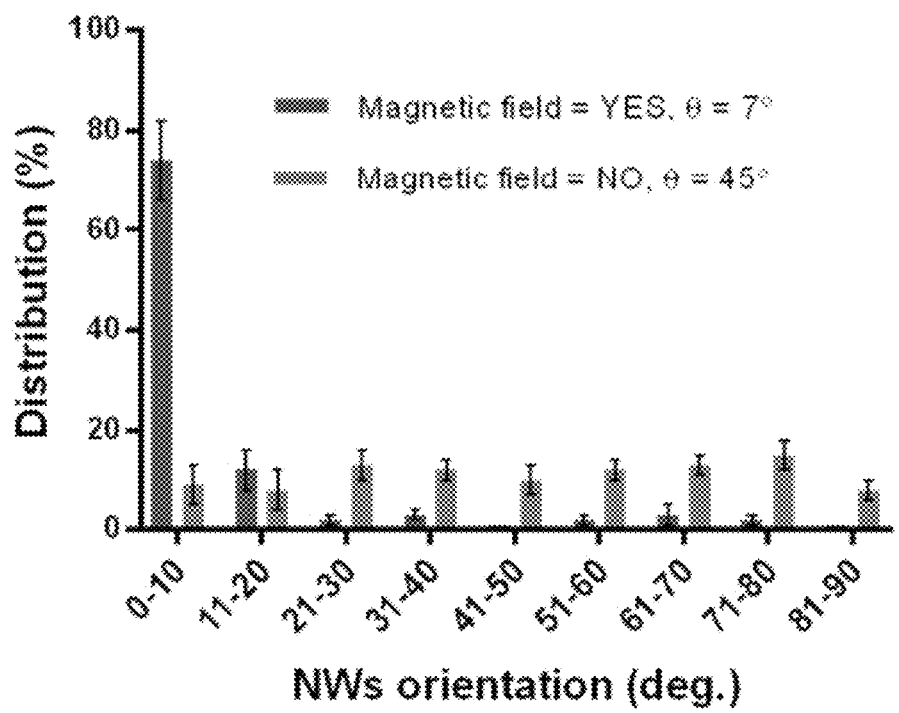
FIGS. 8A and 8B show the orientational distribution in the presence and absence of a magnetic field of 2500 gauss (FIG. 8A) and average alignment angle of Cu/Ni NWs as the applied magnetic field was increased from 0 gauss to 2500 gauss (FIG. 8B); the left bar in each pair is with a magnetic field, and the right (second) bar is without a magnetic field.
Figure 8B:
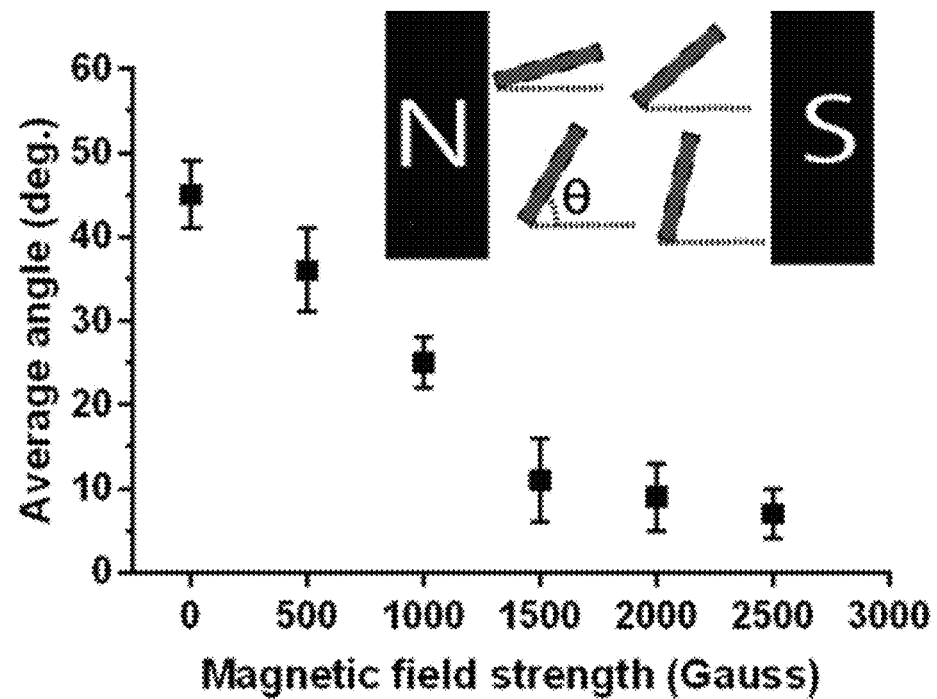
Figure 9A:
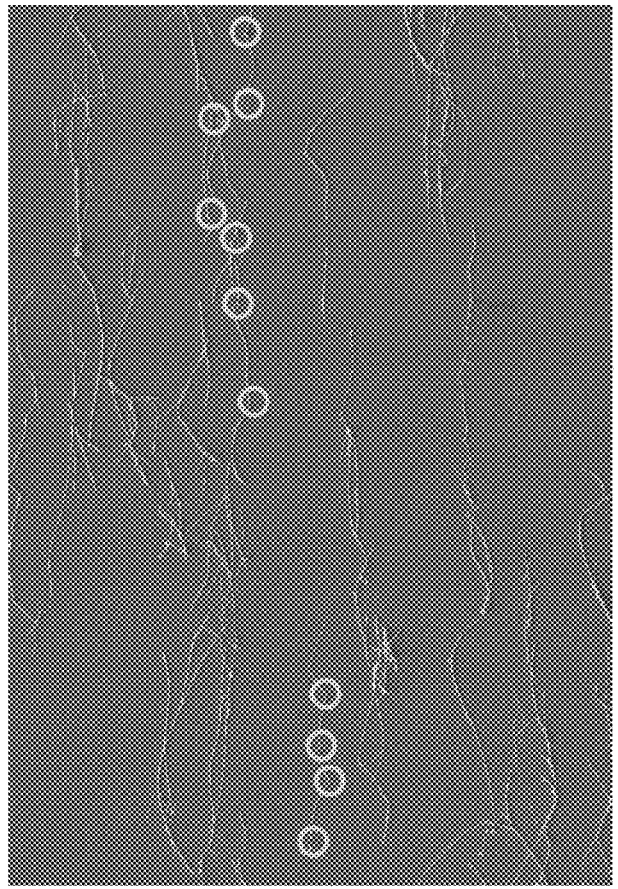
FIGS. 9A-9C are SEM images illustrating end-to-end alignment of Cu/Ni NWs; circles indicate the end-to-end contacts. The images were obtained at magnifications of 1.12Kx (FIG. 9A), 5.00Kx (FIG. 9B), and 73.50Kx (FIG. 9C).
Figure 9C:
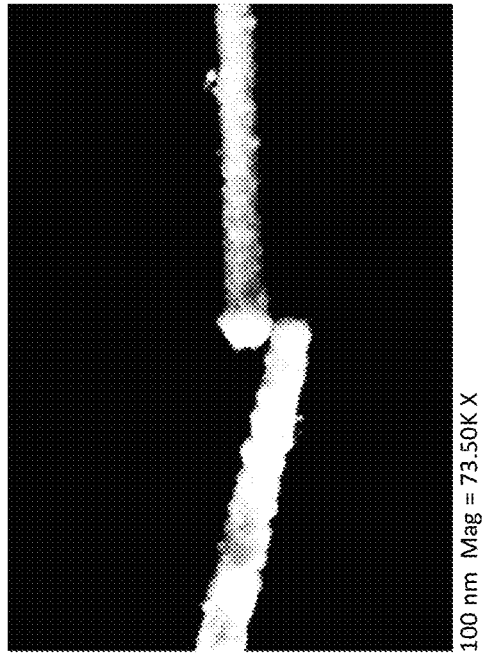
Figure 9B:
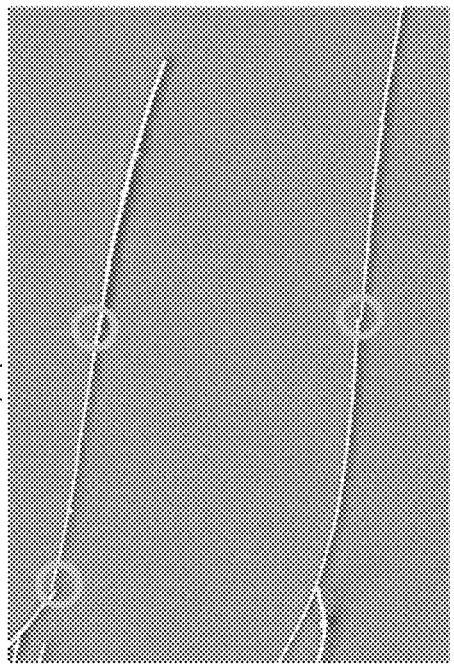

When a suspension of pure Cu NWs or Cu/Ni NWs (FIG. 6A) was allowed to dry under ambient conditions, all of the NWs oriented randomly forming agglomerations (FIG. 7, upper left panel). But in the presence of an applied magnetic field, NWs aligned in the field direction accompanied by the formation of long chains through an end-to-end attachment. FIG. 7 is a series of reflectance optical micrographs showing increasing NW alignment and chain formation as the applied magnetic field was applied and varied from 0 G to 2500 G. FIGS. 8A and 8B show the orientational distribution in the presence and absence of an applied magnetic field of 2500 gauss (FIG. 7A) and average alignment angle of Cu/Ni NWs as the applied magnetic field was increased from 0 gauss to 2500 gauss (FIG. 7B). FIGS. 9A-9C are SEM images illustrating end-to-end alignment of Cu/Ni NWs; circles indicate the end-to-end contacts.

As expected, when the NWs were allowed to dry in the absence of magnetic field (0 gauss), the average alignment angle was observed as $\theta=45\pm4°$ $(=\int \theta P(\theta)d\theta / \int P(\theta)d\theta$, with $P(\theta)=$const). As the magnetic field strength increased, chain lengths and orientational orders increased with average alignment angle reaching $8\pm4°$ at 2500 gauss. Several (>250) isolated Cu/Ni NWs were analyzed to extract an alignment histogram using Image J software freely available on the National Institutes of Health website. Continuous red lines indicate the best-fit line through the Cu/Ni NWs alignment histogram to a gaussian distribution at the applied magnetic field strengths, as indicated.

$$N(\theta) = Ae^{-\left(\frac{(\theta - \langle \theta \rangle)}{\Delta \theta}\right)^2} + B$$

A and B are normalization constant and constant background fitting parameters, respectively. $N(\theta)$ is a number of nanowires oriented at angle θ in a bin size of 0.2 radians. $\langle \theta \rangle$ and $\Delta \theta$ are the average absolute value of the NW orientational angle and the width of the distribution respectively. The best-fit parameters and respective curve fitting uncertainties appear in Table 2.

TABLE 2

| Field Strength (gauss) | ⟨θ⟩ (radian) | Δθ (radian) |
|---|---|---|
| 0 | 0.7 ± 0.1 | 0.4 ± 0.2 |
| 500 | 0.75 ± 0.05 | 0.25 ± 0.08 |
| 1000 | 0.54 ± 0.03 | 0.21 ± 0.03 |
| 1500 | 0.23 ± 0.07 | 0.41 ± 0.08 |
| 2000 | 0.13 ± 0.09 | 0.37 ± 0.09 |
| 2500 | 0.3 ± 0.7 | 0.5 ± 0.3 |

Figure 10:
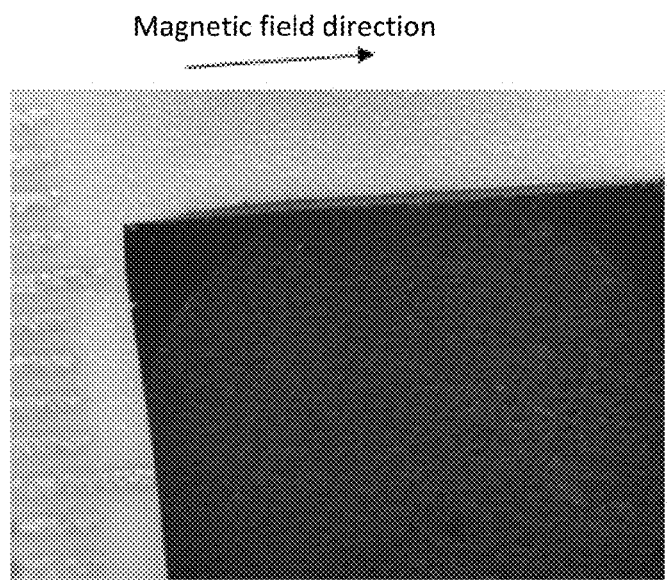
FIG. 10 is a digital photograph illustrating homogeneous alignment of Cu/Ni NWs on a centimeter scale.

Optically, the alignment and chain formation were visible in the suspension within 10 seconds. Surprisingly, even after turning off the magnetic field (H=0 gauss), NWs remained well aligned suggesting a ferromagnetic nature of the Cu/Ni NWs. With current magnetic resonance imaging (MRI) magnets, 450 mm wafers can readily handle even higher magnetic field strengths and larger wafers can be used as well. FIG. 10 illustrates the homogeneity of alignment on a centimeter scale.

Example 2

Coated Nanowire Deposition and Alignment

To self-assemble Cu/Ni nanowires in typical low-k dielectric material (CDO or carbon-doped silicon oxide), a combination of self-assembly and lithographic patterning process was developed. CDO is a nanoporous low-k dielectric material used as an interlayer dielectric (ILD) in advanced ultra-large scale integrated circuits (ULSI). The NW self-assembly protocol discussed below on CDO can also be applied on to the traditional silicon dioxide ($SiO_x$) substrate.

Thiol (—SH) functionalization of a carbon-doped oxide (CDO) wafer was carried out in a three-step approach. The first step was esterification of surface exposed Si—OH functional groups to Si—O-Tf by reaction with triflic anhydride (0.1M $Tf_2O$ (($CF_3SO_2)_2O$) in anhydrous toluene at 50-60° C. for 24 hours). In the second step, the triflate ester was reduced to Si—H by reaction di-isobutylaluminum hydride (0.1M DIBAL-H $(CH_3)_2CHCH_2)_2AlH$) reagent in anhydrous toluene) at 50-60° C. for 24 hours. Finally, the hydrogen-terminated silicon (Si—H) was treated with a 2-propene thiol in presence of UV light ((254 nm, 1 $mW/cm^2$) for 2 hours). The photochemical reaction on the wafer surface in 2-propene thiol ($CH_2$=CH—$CH_2$—SH) solvent generated the thiol-terminated surface. After each reaction, wafers were thoroughly washed with anhydrous toluene solvent and dried by blowing nitrogen gas. All the reactions were carried out inside the dry glove box.

In an FTIR spectrum of the derivatized CDO, signature peaks corresponding to a thiol (—SH) stretch appeared at 2564 $cm^{-1}$ and alkyl peaks at 2800 to 3000 $cm^{-1}$ suggesting the formation of dangling bonds of mercaptopropyl functional groups. An increase in water contact angle (CA) after thiol modification further supported the thiol functionalization of CDO surface.

Figure 11A:
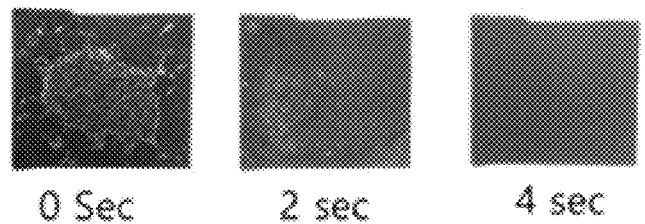
FIGS. 11A and 11B are digital photographs of Cu/Ni NWs on an as-received carbon-doped silicon dioxide (CDO) substrate surface (FIG. 10A) and a thiol-functionalized CDO substrate surface (FIG. 10B) following ultrasonication for varying amounts of time.
Figure 11B:
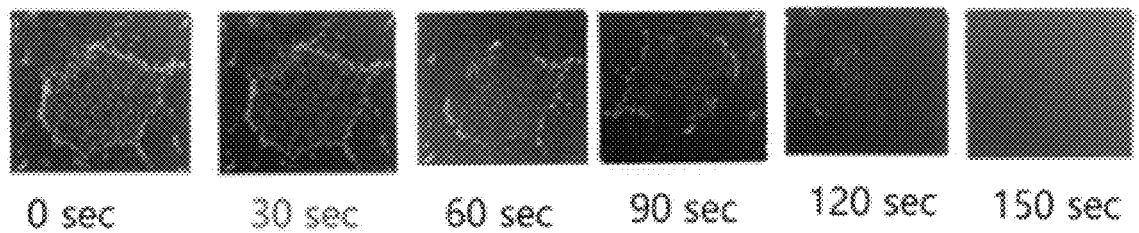

Binding of thiol (—SH) functional groups to copper and nickel is exploited to strongly attach the NWs after deposition onto the functionalized CDO substrate. The strong binding of Cu/Ni NWs to thiol-functionalized CDO surface was confirmed by ultrasonication treatment. The test involved deposition of Cu/Ni NWs aqueous suspension on a clean (control) and thiol-derivatized CDO surfaces followed by drying. The NW laden CDO wafers were immersed in an ethanol solvent in an ultrasonicator (Ultrasonicator, Chicago Electric Power Tools, 2.5 L capacity and operating at 42 kHz frequency). In less than four seconds of ultrasonication, the majority of the NWs were removed from the clean CDO substrate (FIG. 11A), whereas the thiol-functionalized surface held the NWs up to 30 seconds without significant detachment (FIG. 11B).

FIG. 12 schematically depicts a process flow for spatially selective placement of Cu/Ni NWs. The protocol involves first, transferring a desired circuit pattern (e.g., 300 µm×4000 µm channel) onto the thiol-functionalized CDO substrate using a photolithographic process. The thiol-functionalized CDO substrate was spin-coated with positive tone photoresist (SPR 220 3.0, Shipley) to yield a film thickness of 3.0±0.2 µm. Trench patterns (4000 µm×300 µm channels for self-assembly of NWs) were transferred into the photoresist film by exposing the photoresist coated wafer to UV light (365 nm) in a benchtop projection mask aligner (Tamarack scientific Co., Model-162). Processing conditions are shown in Table 3.

TABLE 3

| Photolithography processing steps | Conditions |
|---|---|
| Photoresist | SPR 220 3.0 (Shipley), Positive tone resist |
| Spin coating speed | 3500 RPM for 4 minutes |
| Pre-exposure bake | 110° C. for 90 Sec |
| UV exposure duration | 5 minutes |
| Post-exposure bake | 110° C. for 90 Sec |
| Developer solution | 0.1M NaOH aqueous solution |
| Development time | 40 Sec |

Selective Cu/Ni NWs deposition and alignment on the patterned substrate took place in between the electromagnet poles. Cu/Ni NWs aqueous suspension (100 µL of 0.5 mg/mL solution) was drop-casted on to the substrate and dried in the magnetic field (2500 G). During the drying, NWs deposited on both the thiol-modified trenches on CDO and the remaining photoresist film, with stronger binding to thiol exposed region than the photoresist film respectively, as schematically represented in FIG. 12. Using acetone, the loosely bound NWs and the underlying photoresist film was lifted off the wafer surface leaving only chemically bound NWs in the channel (FIGS. 13A-13B).

Electrical contact pads on both ends of the channel were crafted by depositing 50 µL of silver ink; see inset image in FIG. 13A. For 4000 µm×300 µm channels, the silver ink was deposited on both ends of the NWs self-assembled channel (visible to naked eye) using a micropipette. For smaller channels, silver ink (100 µL) was deposited while observing through the low magnification objective lens (10×) of an optical microscope (Olympus BX51). The silver ink was allowed dry under ambient conditions.

Electrical resistance measurement utilized a PC interfaced Keithley-617 multimeter. The resistance of the dry silver ink was <1Ω<<$R_{channel}$. Control samples included devices made of randomly oriented (i.e., in the absence of H field) Cu/Ni and pure Cu NWs. FIGS. 14-16 are optical micrographs at various magnifications showing the randomly aligned Cu NWs (FIG. 14), randomly aligned Cu/Ni NWs (FIG. 15), and magnetically aligned Cu/Ni NWs (FIG. 16). The average (of three samples) resistance values of devices made of well-aligned Cu/Ni NWs, and randomly arranged Cu/Ni NWs and pure Cu NWs were 290±20 kΩ, 780±40 kΩ, and 370±30 kΩ respectively (FIG. 17).

Figure 18:
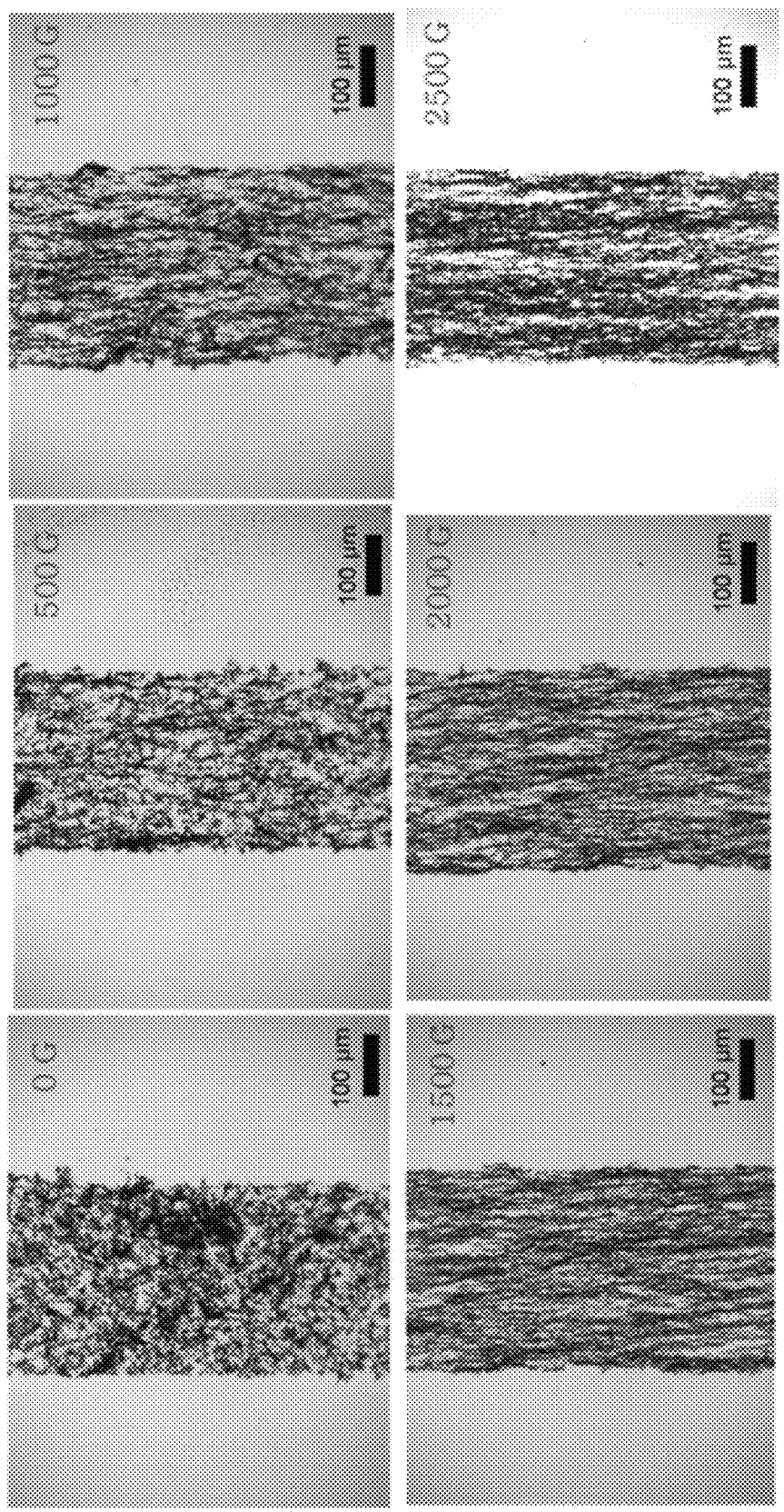
FIG. 18 is an optical image of Cu/Ni NWs deposited in a lithographically patterned channel in applied magnetic field strength varying from 0 to 2500 gauss.

The effect of alignment on resistance was investigated by fabricating the device wherein NWs were deposited and dried under the magnetic field strength that varied from 0 to 2500 gauss. Optical micrographs (FIG. 18) revealed increased alignment and NW chain length with increasing magnetic field strength. The channel resistance decreased with increasing field strength (FIG. 19). The decrease of resistance in aligned samples was unexpected from theoretical consideration as well as experimental results on aligned metallic or carbon nanotube-based samples (Mutiso et al., *ACS nano* 2013, 7:7654-7663). The effective coordination number for aligned samples is expected to be smaller than unaligned samples. Thus, the reduction of resistance could be attributed to the ferromagnetism of nickel which would enhance the end-to-end NW contacts leading to formation of linear as chains that provide a shorter pathlength for electrons travelling between electrodes.

Figure 20:
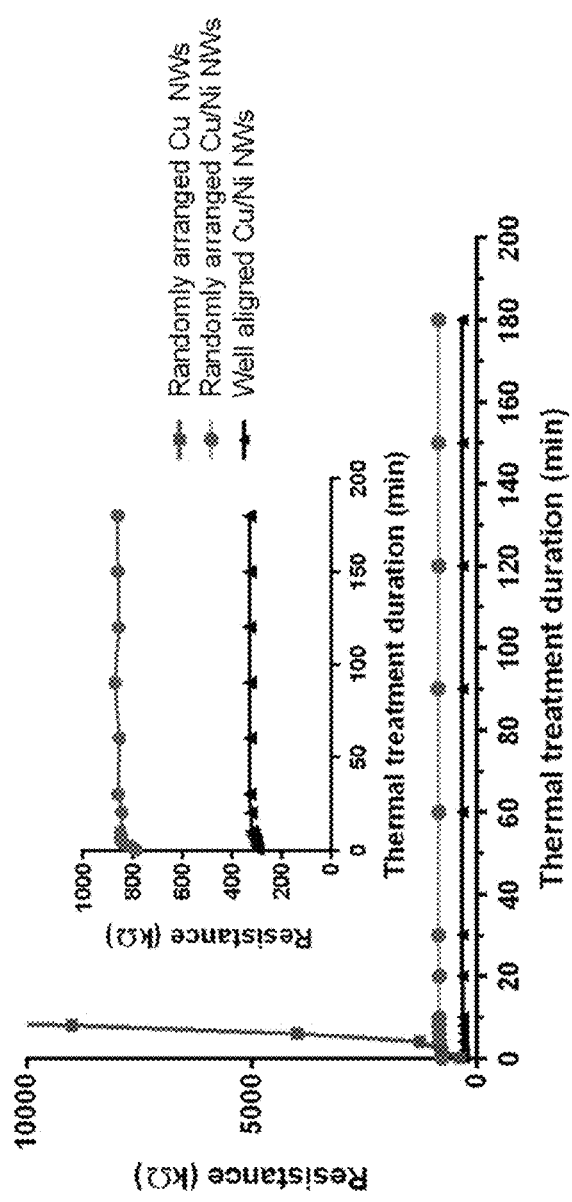
FIG. 20 is a graph showing thermal stability of well-aligned and randomly arranged Cu/Ni NWs in a channel and randomly arranged Cu NWs in a channel at 100° C. in air. The inset plot highlights the resistance curves of two types of Cu/Ni NW arrangements.

Metallic contacts between copper NWs are typically hampered by its propensity to form a film of surface oxide. Greater oxidative, thermal stability of Ni compared to copper was observed in these devices when kept at 100° C. in air (FIG. 20). The resistance of pure Cu NWs resistor rapidly increased and reached 20 MΩ channel resistance in less than 10 minutes due to their rapid areal oxidation Cu NW surface; red colored channel turned black. Whereas, for Cu/Ni NWs, initial rapid rise (~11%) in resistance leveled off and remained constant for well over 72 hours consistent with the expected thermal stability.

Figure 21:
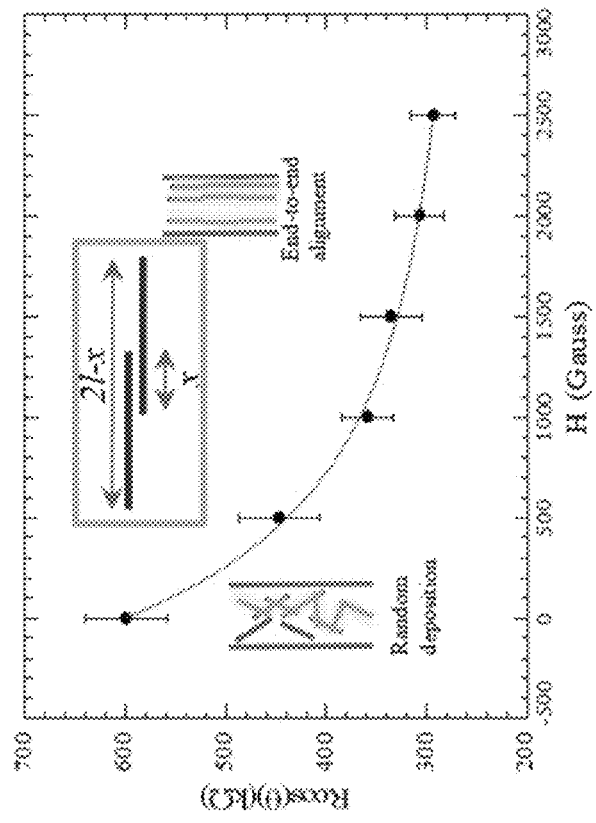
FIG. 21 is a graph illustrating field dependence of resistance assuming a linear relation between a and H. The line shows a best nonlinear least squares (NLS) fit. In insets yellow shading indicates the path of electrons in unaligned and unaligned samples.

The resistance of the NWs based interconnect channel is determined by the number of effective conductive channels that successfully allow the electrons to pass through from one end to the other end of the channel. As shown in FIG. 6a (inset), increased orientational and positional (i.e., end-to-end) alignment would increase the number of channels. The expected electron path length is expected to scale inversely with lcosθ, where l and θ are the average NW length and alignment angle (see FIG. 8B and Table 2 (above)). Consider a case of two aligned but unmagnetized NWs. The probability of one end of NW interacting along the length of the other NW is constant, and the average length of the binary pair is 3l/2. In general the overall length of the aligned NW pair would be 2l–x, where x is the distance between two ends of the contacting NWs (FIG. 21, inset). We assume a Gaussian distribution of contact with respect to ends, i.e., for x. Then the probability of the first NW attached to the second NW at point x is: $p(x)=e^{-\alpha x^2}$ where α is a function of magnetic field. Averaging over the Gaussian distribution, it can be shown that:

$$\langle 2l - x \rangle = 2l - \frac{1}{\sqrt{\pi\alpha}} \frac{(1 - e^{-\alpha l^2})}{\text{erf}(\sqrt{\alpha}\, l)}$$

The orientation dependence of NW is introduced by scaling with cos(θ); this allows to scale resistance as:

$$R(H) \propto \frac{1}{\langle 2l - x \rangle \cos(\theta)} \quad (2)$$

The proportionality factor in the eqn 2, would include spacing between the two electrodes and geometric and electric resistivity parameters of the NWs. In this crude model, R(H) is simply proportional to the number of inter NW hops (~L/<2l–x>cos(θ); where L is distance between the two electrodes) that an electron undergoes in going from one electrode to another. The field dependence of the resistance can be related to an effective increase in the length of the binary pair from 3/2l to 2l which in turn reduces the number of end-to-end NW hops.

For example, a linear dependence of α with H, i.e., α~H, provides a reasonable fit to the resistance data as shown in FIG. 21, which illustrates the combined effect of orientational and positional alignment qualitatively. Note that there are only two adjustable parameters: one the proportionality factor in eqn. 2 and the second between α and H. In case of perfect orientational and positional ordering into linear chains, the conductivity would be proportional to number channels or linearly dependent on the total number of deposited NWs between electrodes (FIG. 21 insets showing electron path in yellow colors).

Figure 22:
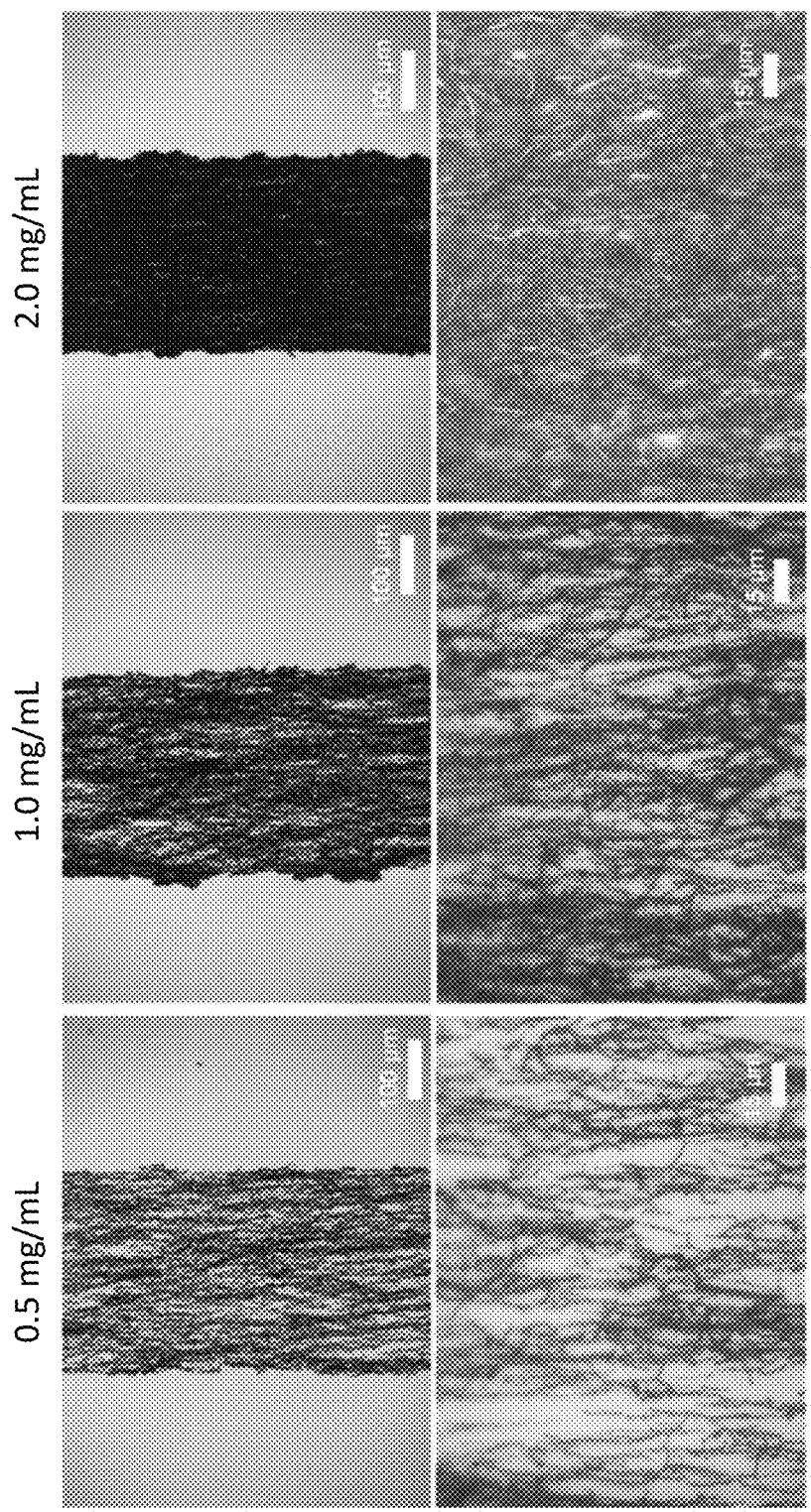
FIG. 22 is a series of low and high magnification optical micrographs showing the effect of NW concentrations of 0.5 mg/mL, 1.0 mg/mL, and 2 mg/mL aligned with a magnetic field strength of 2500 gauss.
Figure 23:
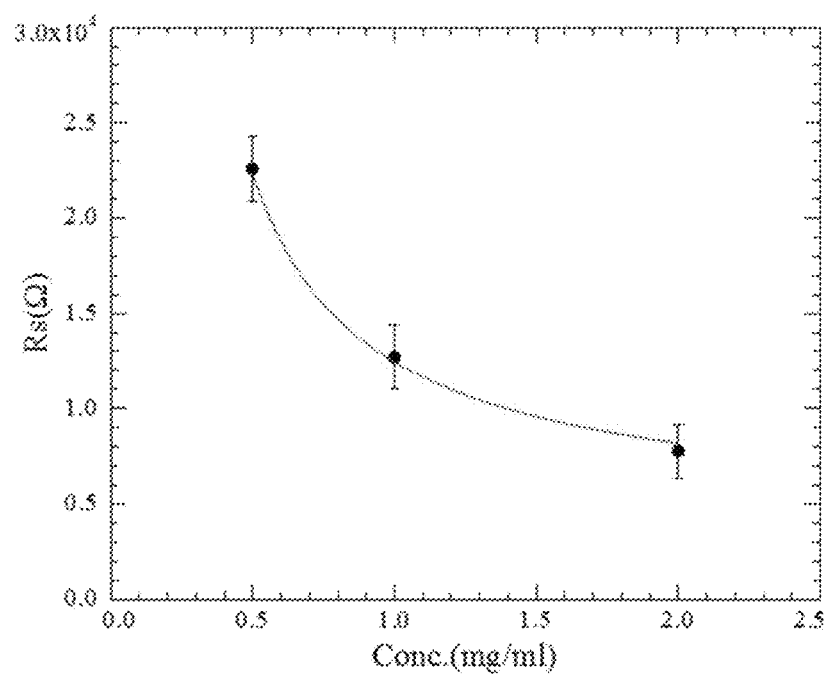
FIG. 23 is a graph showing sheet resistance as a function of the concentration of NWs deposited onto a substrate and magnetically aligned.

To increase the number of channels in the trench, the density of NWs was raised by increasing the concentration of NWs in depositing suspension. Optical micrographs of the channels deposited at various concentrations appear in FIG. 22. The resistance showed a decrease in the sheet resistance values from 300±20 kΩ (0.5 mg/mL), 170±20 kΩ (1.0 mg/mL) to 100±20 kΩ (2.0 mg/mL) as the concentration of NWs in the suspension increased (FIG. 23). An optical micrograph indicated that even at 0.5 mg/mL these assemblies are well beyond the percolation limit, as verified by fitting the resistance data to a percolation model that predicted a threshold concentration of 0.09 mg/mL. The areal fraction of the NWs channel was calculated in an automatic threshold analysis method (Lever's rule) using an Image-J application (Freeware available from NIH). The NW areal fraction data were fitted to a Langmuir type model with respect to the concentration of NWs (i.e., A≈a·C/(1+ b·C) where C is the NW concentration in depositing solution. The best-fit values of a and b were 0.96±0.04, 0.53±0.05 a). The sheet resistance of well-aligned Cu/Ni NWs as a function of the areal fraction for NW deposits generated by 0.5, 1.0 and 2.0 mg/mL NW concentration. The percolation model of conductivity was used to fit the data with following fitting equation R(kΩ)=6.7 (A−0.08)$^{-1.0}$, with A denoting the areal fraction of NWs. The value of the conductivity exponent was fixed at 1. The best-fit percolation threshold, 0.08, corresponded to the NW concentration of 0.087 mg/mL back-calculated using the best-fit values of a and b.

Recent theoretical work suggests that the sheet resistance of a random/isotropic network beyond percolation should follow:

$$R_{sn} = \frac{\pi}{2\sqrt{n(cn - 1 + e^{-cn})}} \left\{ \frac{4\rho}{D^2} + \frac{R_j cn}{(1 - e^{-cn} - cne^{-cn})} \right\} \quad (3)$$

Where $R_{sn}$ is the sheet resistance, ρ resistivity of copper, and n the number of NWs in l×l area (where l is the length of NW, 15 μm and D its diameter, 200 nm), $R_j$ is the junction resistance and c=0.2017π. Assuming n=kC, where C is a concentration of nanowires in mg/mL. k is estimated using:

$$n = \frac{10^{-3} l^2 V_D}{\pi D^2 l \rho_{Cu}} C \quad (4)$$

The above expression accounts for the observed spread of 100 μL drop spreading over area of about 1 cm². In this expression, $\rho_{Cu}$, is the density of copper, 8.9 gm/cm³, and $V_D$ is the volume of deposited NW suspension, 0.1 mL; all other quantities are in CGS units. Whether estimated from the expression above or extracted as a free parameter in a nonlinear least squares fit of $R_{sn}$ vs. C, we calculate a k value of approximately 120>>5.7. The number 5.7 is the expected number of NWs in the l×l area at the percolation threshold. Calculated and the fitted value of k further confirms that the concentration employed in these studies well exceed the expected values at the percolation threshold. Setting k=120, a single parameter fit allowed an estimation of the junction resistance of 10±2 kΩ. Experiments conducted just above the percolation limit corroborated this value of the junction resistance.

The high value of NW to NW junction resistance ($R_j$), perhaps arising from electron tunneling through native surface oxide film on the NW, could account for the observed high channel resistance. In contrast, the average contact resistance ($R_J$) value of silver nanowires was 2 kΩ derived by fitting the experimental values of the sheet resistance of Ag NWs films and its areal density (Mutiso et al., *ACS nano*

2013, 7:7654-7663) and 8 kΩ for plasmonically welded Ag NWs (Garnett et al., *Nature Materials* 2012, 11:241-249). NW to NW contact resistant can be decreased by fusing or welding at NW to NW contact point, by laser or thermal assisted nano-welding techniques. Such investigations are currently underway.

Figure 24:
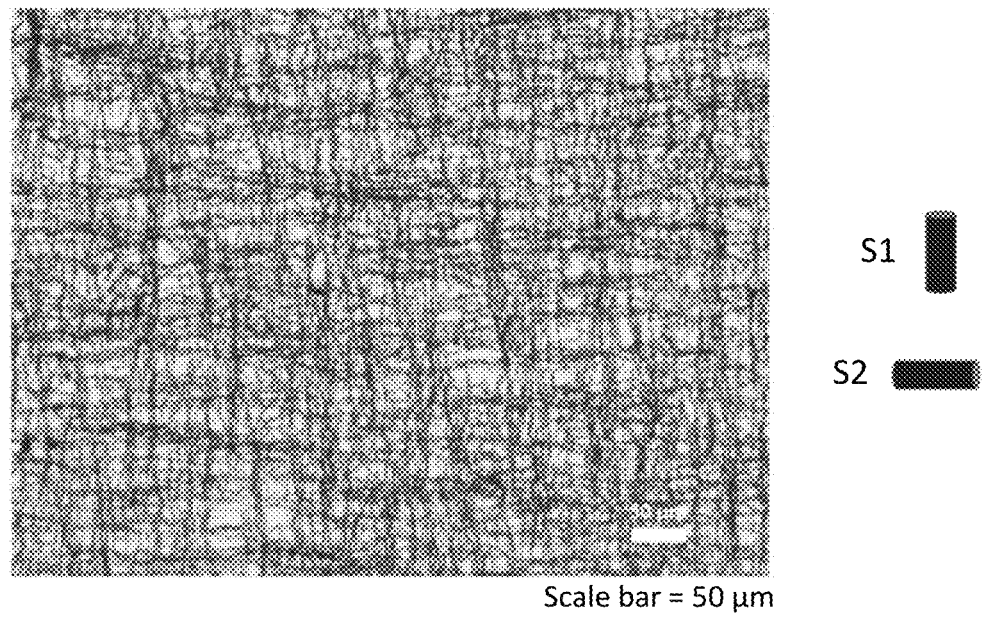
FIG. 24 is an optical micrograph showing two sets (S1, S2) of Cu/Ni NWs magnetically aligned in orthogonal directions.
Figure 25:
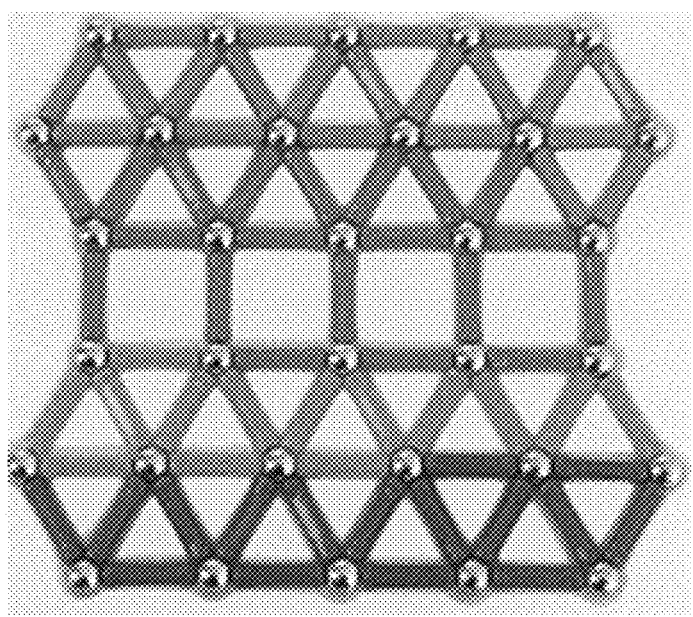
FIG. 25 is a schematic illustration of a complex NW network including four alignment steps.
Figure 25:
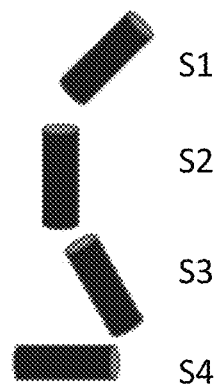

In some examples, the process of applying a photoresist film, patterning the film, depositing NWs, and magnetically aligning the NWs can be repeated one or more times. In each repetition, the magnetic field may be applied in a different direction. FIG. 24 is an optical micrograph showing two sets (S1, S2) of Cu/Ni NWs magnetically aligned in orthogonal directions. FIG. 25 is a schematic illustration of a complex aligned NW network including four alignment steps.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:

1. A method, comprising:
    forming a photoresist film covering a thiol-functionalized surface of a substrate;
    patterning, after forming the photoresist film, the photoresist film with a plurality of openings by exposing the photoresist film to an ultra-violet (UV) light source;
    depositing, after patterning the photoresist film, a solution comprising a plurality of coated nanowires and a solvent into the plurality of openings, onto the thiol-functionalized surface of the substrate, and onto the photoresist film covering respective surfaces of the photoresist film facing away from the thiol-functionalized surface of the substrate with respective ones of the coated nanowires, each one of the coated nanowires comprising a nanowire core and a ferromagnetic coating on the nanowire core;
    applying a homogeneous directional magnetic field to the substrate surface and the coated nanowires for an effective period of time to align at least some of the coated nanowires in the direction of the magnetic field;
    evaporating the solvent while applying the directional magnetic field, thereby aligning the coated nanowires and binding the coated nanowires to the thiol-functionalized surface of the substrate; and
    removing, after evaporating the solvent, the photoresist film from the thiol-functionalized surface of the substrate thereby removing the respective ones of the coated nanowires on respective surfaces of the photoresist film facing away from the thiol-functionalized surface of the substrate.

2. The method of claim 1 wherein applying the homogenous directional magnetic field for the effective period of time provides an average alignment angle of the coated nanowires within a range of 0-20°.

3. The method of claim 1 wherein the ferromagnetic coating has an average thickness within a range of from 1-30 nm and:
    (i) the homogenous directional magnetic field has a strength of at least 1000 gauss; or
    (ii) the effective period of time for applying the homogenous directional magnetic field is at least 10 seconds; or
    (iii) both (i) and (ii).

4. The method of claim 1 wherein patterning the photoresist film forming one or more exposed regions of thiol groups aligned with ones of the plurality of openings and one or more regions covered with the photoresist film prior to depositing the solution comprising the plurality of coated nanowires onto the thiol-functionalized surface, whereby upon applying the homogenous directional magnetic field and evaporating the solvent, the aligned coated nanowires bind to the one or more exposed regions of thiol groups.

5. The method of claim 4, wherein removing, after evaporating the solvent, the photoresist film includes leaving the aligned coated nanowires bound to the one or more exposed regions of thiol groups forming a first set of aligned coated nanowires bound to the substrate via the one or more exposed regions of thiol groups.

6. The method of claim 1, further comprising forming coated nanowires by electroless deposition of the ferromagnetic coating onto the nanowire cores.

7. The method of claim 6 wherein the ferromagnetic coating is nickel, cobalt, iron, iron oxide or a combination thereof.

8. The method of claim 7 wherein electroless deposition of the ferromagnetic coating comprises:
    combining an aqueous metal salt solution comprising a reducing agent and a metal salt with a suspension comprising nanowire cores and mixing to form a metal salt and nanowire suspension, wherein the metal salt comprises a metal comprising nickel, cobalt, iron, or a combination thereof;
    heating the metal salt and nanowire suspension at an effective temperature for an effective period of time to form coated nanowires comprising the nanowire cores coated with the metal.

9. The method of claim 8 wherein:
    (i) the metal salt and nanowire suspension comprises 1.5-2.5 mM metal ions; or
    (ii) the reducing agent is hydrazine; or
    (iii) the suspension comprising nanowires has a nanowire concentration of 0.1-5 mg/mL; or
    (iv) the effective temperature is within a range of 100° C. to 150° C.; or
    (v) the effective period of time is at least 7 minutes; or
    (vi) any combination of (i), (ii), (iii), (iv), and (v).

10. The method of claim 8 wherein the metal is nickel and the metal salt is $Ni(NO_3)_2$.

11. The method of claim 1 wherein the nanowire cores are copper, silver, silicon, or carbon nanotubes.

12. The method of claim 11 wherein the nanowire cores are copper or silver, the method further comprising preparing the copper or silver nanowire cores by:
    adding a growth directing agent and a reducing agent to an aqueous solution and mixing a resulting solution, the aqueous solution comprising a copper (II) or silver (I) and a base, the copper (II) or silver (I) salt providing copper or silver ions in the aqueous solution;
    maintaining the resulting solution at a temperature within a range of 60–90° C. for an effective period of time to reduce the copper or silver ions and form copper or silver nanowire cores.

13. The method of claim 12 wherein:
    (i) the resulting solution comprises $3\times10^{-3}$ M to $7\times10^{-3}$ M copper or silver ions;
    (ii) the growth directing agent is ethylenediamine; or
    (iii) the reducing agent is hydrazine and the resulting solution comprises $4\times10^{-3}$ M to $1\times10^{-2}$ M hydrazine; or (iv) the reducing agent is hydrazine and the resulting solution comprises the copper or silver ions and hydrazine in a molar ratio of from 2:1 to 0.25:1; or
(v) the effective period of time is at least 20 minutes; or
(vi) any combination of (i), (ii), (iii), (iv), and (v).

14. The method of claim 12 wherein the nanowire cores are copper and the aqueous solution comprises a copper (II) salt.

15. The method of claim 1 wherein:
(i) the coated nanowires have an average length of at least 5 μm; or
(ii) the nanowire cores have an average diameter ≤300 nm; or
(iii) the nanowire cores have an aspect ratio ≥20; or
(iv) the nanowire cores have a surface vertical roughness ≤20 nm; or
(v) any combination of (i), (ii), (iii), and (iv).

16. The method of claim 1, further comprising, after evaporating the solvent, subsequently removing at least a portion of the ferromagnetic coating from an upper surface of the aligned coated nanowires.

17. The method of claim 16 wherein the ferromagnetic coating is nickel and subsequently removing at least a portion of the ferromagnetic coating from an upper surface of the aligned coated nanowires comprises wet etching with an aqueous $FeCl_3$ solution at pH 6-8 at a temperature within a range of 0-10° C.

18. The method of claim 1 wherein:
(i) the coated nanowires are nickel-coated copper nanowires; or
(ii) the thiol-functionalized surface of the substrate comprises thiol-functionalized carbon-doped silicon oxide or thiol-functionalized silicon oxide; or
(iii) both (i) and (ii).

19. The method of claim 1 wherein the thiol-functionalized surface of the substrate comprises thiol-functionalized carbon-doped silicon oxide or thiol-functionalized silicon oxide.

20. The method of claim 19 further comprising preparing the thiol-functionalized surface of the substrate by:
esterifying ≡Si—OH functional groups on a surface of the substrate to form triflate groups (≡Si—O-Tf);
reducing the triflate groups to form ≡Si—H groups; and
hydrosilylating the ≡Si—H groups with an alkenyl thiol to form ≡Si—$(CH_2)_x$—SH groups where x is an integer from 3 to 18.

21. The method of claim 20, wherein the alkenyl thiol is 2-propene-1-thiol.

22. A method, comprising:
preparing a thiol-functionalized surface of a substrate comprising:
esterifying ≡Si—OH functional groups on a surface of the substrate to form triflate groups (≡Si—O-Tf);
reducing the triflate groups to form ≡Si—H groups; and
hydrosilylating the ≡Si—H groups with an alkenyl thiol to form ≡Si—$(CH_2)_x$—SH groups where x is an integer from 3 to 18;
depositing a solution comprising a plurality of coated nanowires and a solvent onto the thiol-functionalized surface of the substrate, the coated nanowires comprising a nanowire core and a ferromagnetic coating on the nanowire core;
applying a homogeneous directional magnetic field to the substrate surface and the coated nanowires for an effective period of time to align at least some of the coated nanowires in the direction of the magnetic field; and
evaporating the solvent while applying the directional magnetic field, whereby the aligned coated nanowires bind to the thiol-functionalized surface of the substrate.

23. The method of claim 22, wherein the alkenyl thiol is 2-propene-1-thiol.

24. A method, comprising:
forming a thiol-functionalized surface of a substrate including:
esterifying ≡Si—OH functional groups on a surface of the substrate to form triflate groups (≡Si—O-Tf);
reducing the triflate groups to form ≡Si—H groups; and
hydrosilylating the Si—H groups with an alkenyl thiol to form ≡Si—$(CH_2)_x$—SH groups where x is an integer from 3 to 18;
depositing a solution comprising a plurality of coated nanowires and a solvent onto the thiol-functionalized surface of the substrate, each one of the coated nanowires comprising a nanowire core and a ferromagnetic coating on the nanowire core;
applying a homogeneous directional magnetic field to the coated nanowires on the thiol-functionalized surface of the substrate for an effective period of time aligning first ends of at least some of the coated nanowires with second ends of at least some of the coated nanowires forming one or more chains of the coated nanowires extending in the direction of the directional magnetic field, each one of the first ends being adjacent to a corresponding one of the second ends; and
evaporating the solvent while applying the directional magnetic field to the coated nanowires, thereby binding the coated nanowires and their connected chains parallel to the thiol-functionalized surface of the substrate.

25. The method of claim 24, wherein evaporating the solvent while applying the directional magnetic field to the coated nanowires forms an interconnect extending along the substrate and on the thiol-functionalized surface of the substrate.

26. The method of claim 25, wherein forming the interconnect includes extending the interconnect from a first contact pad on the substrate to a second contact pad of the substrate coupling the first contact pad to the second contact pad with the interconnect.

27. The method of claim 24, further comprising:
forming a temporary film on and covering the thiol-functionalized surface of the substrate;
patterning the temporary film on the thiol-functionalized surface of the substrate with one or more openings exposing one or more regions of the thiol-functionalized surface; and
removing the temporary film from the thiol-functionalized surface of the substrate.

28. The method of claim 27, wherein:
depositing the solution comprising the plurality of coated nanowires and the solvent onto the thiol-functionalized surface of the substrate includes depositing the solution in the openings, on the regions of the thiol-functionalized surface exposed by the openings, and on respective surfaces of the temporary film facing away from the thiol-functionalized surface; and
removing the temporary film from the thiol-functionalized surface of the substrate includes removing, after evaporating the solvent, respective ones of the plurality of coated nanowires on the respective surfaces of the temporary film facing away from the thiol-functionalized surface.

* * * * *